US009057964B2

(12) United States Patent
Mann et al.

(10) Patent No.: US 9,057,964 B2
(45) Date of Patent: *Jun. 16, 2015

(54) IMAGING OPTICS AND PROJECTION EXPOSURE INSTALLATION FOR MICROLITHOGRAPHY WITH AN IMAGING OPTICS

(75) Inventors: Hans-Juergen Mann, Oberkochen (DE); Johannes Zellner, Aalen (DE); Aurelian Dodoc, Heidenheim (DE); Claus Zahlten, Heidelberg (DE); Christoph Menke, Oberkochen (DE); Marco Pretorius, Oberkochen (DE); Wilhelm Ulrich, Aalen (DE); Hans-Juergen Rostalski, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 796 days.

This patent is subject to a terminal disclaimer.

(21) Appl. No.: 13/236,873

(22) Filed: Sep. 20, 2011

(65) Prior Publication Data

US 2012/0069315 A1 Mar. 22, 2012

Related U.S. Application Data

(63) Continuation of application No. PCT/EP2010/001512, filed on Mar. 11, 2010.

(60) Provisional application No. 61/164,520, filed on Mar. 30, 2009.

(51) Int. Cl.
*G02B 17/06* (2006.01)
*G03F 7/20* (2006.01)
*G02B 17/08* (2006.01)

(52) U.S. Cl.
CPC ........ *G03F 7/70233* (2013.01); *G02B 17/0663* (2013.01); *G02B 17/0888* (2013.01)

(58) Field of Classification Search
CPC ........... G02B 17/0663; G02B 17/0888; G02B 17/0647; G02B 17/0621; G02B 5/0891; G03F 7/70233; G03F 7/702; G03F 7/70216
See application file for complete search history.

(56) References Cited

U.S. PATENT DOCUMENTS 6,033,079 A 3/2000 Hudyma
6,183,095 B1 2/2001 Hudyma (Continued)

FOREIGN PATENT DOCUMENTS

CN 101221279 7/2008
EP 0 744 665 11/1996

(Continued)

OTHER PUBLICATIONS

Japanese office action, with English translation thereof, for JP Appl No. 2012-505482, dated Nov. 8, 2013.

(Continued)

*Primary Examiner* — Steven H Whitesell Gordon
*Assistant Examiner* — Michelle Iacoletti
(74) *Attorney, Agent, or Firm* — Fish & Richardson P.C.

(57) ABSTRACT

Imaging optics includes a first mirror in the imaging beam path after the object field, a last mirror in the imaging beam path before the image field, and a fourth to last mirror in the imaging beam path before the image field. In an unfolded imaging beam path between the object plane and the image plane, an impingement point of the chief ray on a used region of each of the plurality of mirrors has a mirror spacing from the image plane. The mirror spacing of the first mirror is greater than the mirror spacing of the last mirror. The mirror spacing of the fourth to last mirror is greater than the mirror spacing of the first mirror. Chief rays that emanate from points of the object field that are spaced apart from another have a mutually diverging beam course, giving a negative back focus of the entrance pupil.

20 Claims, 11 Drawing Sheets

(56) References Cited

U.S. PATENT DOCUMENTS

| | | | | |
|---|---|---|---|---|
| 6,229,595 | B1 | 5/2001 | McKinley et al. | |
| 6,929,373 | B2 | 8/2005 | Yoshikawa et al. | |
| 6,985,210 | B2 | 1/2006 | Hudyma et al. | |
| 7,348,565 | B2 | 3/2008 | Mann et al. | |
| 7,414,781 | B2 | 8/2008 | Mann et al. | |
| 7,450,301 | B2 | 11/2008 | Mann et al. | |
| 7,682,031 | B2 | 3/2010 | Mann et al. | |
| 7,973,908 | B2 | 7/2011 | Mann | |
| 8,208,200 | B2 | 6/2012 | Mann | |
| 2007/0058269 | A1* | 3/2007 | Mann et al. | 359/726 |
| 2008/0165415 | A1 | 7/2008 | Chan et al. | |
| 2008/0170310 | A1 | 7/2008 | Mann | |
| 2009/0051890 | A1* | 2/2009 | Mann et al. | 355/67 |

FOREIGN PATENT DOCUMENTS

| | | |
|---|---|---|
| EP | 1 209 503 A2 | 5/2002 |
| EP | 1 930 771 A1 | 6/2008 |
| JP | 2001-185480 | 7/2001 |
| JP | 2002-015979 | 1/2002 |
| JP | 2004-029625 | 1/2004 |
| JP | 2005-172988 | 6/2005 |
| JP | 2008-158211 | 7/2008 |
| JP | 2008-176326 | 7/2008 |
| JP | 2008-203820 | 9/2008 |
| TW | 594043 | 6/2004 |
| TW | 200632372 A | 9/2006 |
| WO | WO 2006/069725 | 7/2006 |
| WO | WO 2006/119977 | 11/2006 |

OTHER PUBLICATIONS

European search report with respect to European patent application No. 11 185 707.4, dated Mar. 26, 2012.

The International Search Report for the corresponding PCT Application No. PCT/EP2010/001512, mailed Aug. 8, 2010.

B. Tatian, “Nonrotationally Symmetric Systems: A New Problem for Optical Design and Fabrication, Applications of Geometrical Optics”, Proc. SPIE, 39:205, (1973).

B. Tatian, “Testing an Unusual Optical Surface”, International Lens Design Conference, Proc. SPIE, 554:139, (1985).

Chinese Office Action, with translation thereof, for corresponding CN Appl No. 201080023767.6, dated Mar. 5, 2013.

Taiwanese office action, with English translation thereof, for TW Appl No. 97 101 634, dated Sep. 10, 2013.

Taiwanese office action, with English translation thereof, for TW Appl No. 99 109 359, dated Aug. 4, 2014.

* cited by examiner

IMAGING OPTICS AND PROJECTION EXPOSURE INSTALLATION FOR MICROLITHOGRAPHY WITH AN IMAGING OPTICS

CROSS-REFERENCE TO RELATED APPLICATIONS

This application is a continuation of, and claims benefit under 35 USC 120 to, international application PCT/EP2010/001512, filed Mar. 11, 2010, which claims benefit under 35 USC 119(e) of U.S. Ser. No. 61/164,520, filed Mar. 30, 2009. International application PCT/EP2010/001512 is hereby incorporated by reference in its entirety.

FIELD

The disclosure relates to an imaging optics with a plurality of mirrors which image an object field in an object plane into an image field in an image plane. The disclosure also relates to a projection exposure installation with such an imaging optics, a method for producing a structured component with such a projection exposure installation, and a microstructured or nanostructured component produced by such a method.

BACKGROUND

Imaging optics are known from U.S. Pat. No. 7,414,781, U.S. Pat. No. 7,348,565 B2 and WO 2006/119 977 A1.

SUMMARY

The disclosure provides an imaging optics with a plurality of mirrors which image an object field in an object plane into an image field in an image plane, where the imaging optics exhibits a manageable combination of small imaging errors, manageable production and good throughput for the imaging light.

In a first aspect, the disclosure provides an imaging optics with a plurality of mirrors which image an object field in an object plane into an image field in an image plane,

- with a first mirror in the imaging beam path of imaging light after the object field, and
- with a last mirror in the imaging beam path of imaging light before the image field,
- wherein, in the unfolded imaging beam path, an impingement point of a chief ray, which belongs to a central object field point, on a used region of each of the mirrors, which is configured to guide the imaging light, has a mirror spacing from the image plane,
- the mirror spacing of the first mirror is greater than the mirror spacing of the last mirror, and
- the mirror spacing of a fourth to last mirror is greater than the mirror spacing of the first mirror.

Because the first mirror is closer to the image plane than the fourth to last mirror, a design can be implemented, in which, in particular on the first mirror, only small angles of incidence can be implemented for the imaging light. In addition, this first mirror may be configured with an advantageously large reflection surface. A first mirror is produced with an advantageously low intensity loading with the imaging light, while, on the other hand, owing to the possibility of small angles of incidence even with very small wavelengths of the imaging light (in particular with EUV wavelengths) for example owing to a corresponding mirror coating, a high degree of reflection can be achieved. The design according to the disclosure also leads to the fact that the first mirror has a reflection surface, which with regard to its area is not substantially greater, for example, than the mirror surface of the last mirror of the imaging optics, which generally predetermines the numerical aperture on the image side, which in turn leads to manufacturing advantages. Overall, the design according to the disclosure is an advantageous compromise with regard to the reflection surface of the first mirror, low angles of incidence being simultaneously implemented on this mirror. If the imaging optics has a folded beam path with a flat folding mirror, this imaging beam path is firstly unfolded to determine the mirror spacings. The unfolded imaging beam path of the imaging optics is thus always observed to predetermine the mirror spacings according to the disclosure from the image plane. A pupil of an imaging optics is generally taken to mean all the images of the aperture stop which limit the imaging beam path. The planes in which these images come to lie are called pupil planes. As, the images of the aperture stop are not inevitably precisely planar, the planes which approximately correspond to these images are also in general called pupil planes. The plane of the aperture stop itself is also called the pupil plane. If the aperture stop is not planar, as in the images of the aperture stop, the plane which most closely corresponds to the aperture stop is called the pupil plane.

The entry pupil of the imaging optics is taken to mean the image of the aperture stop which is produced if the aperture stop is imaged by the part of the imaging optics, which is located between the object plane and aperture stop. Accordingly, the exit pupil is the image of the aperture stop which is produced if the aperture stop is imaged by the part of the imaging optics, which is located between the image plane and aperture stop.

If the entry pupil is a virtual image of the aperture stop, in other words the entry pupil plane is located before the object field, a negative back focus of the entry pupil is referred to. In this case, the chief rays or main beams to all the object field points extend as if they were to come from one point before the imaging beam path. The chief ray to each object point is defined as the connecting beam between the object point and the centre point of the entry pupil. In the case of a negative back focus of the entry pupil, the chief rays to all the object points therefore have a divergent beam course on the object field.

An alternative definition of a pupil is that region in the imaging beam path of the imaging optics, in which the individual beams issuing from the object field points intersect, which, relative to the chief rays issuing from the object field points, are in each case associated with the same illumination angle. The plane in which the intersection points of the individual beams are located according to the alternative pupil definition or which comes closest to the spatial distribution of these intersection points, which does not inevitably have to be located precisely in a plane, can be called the pupil plane.

In a second aspect, the disclosure provides an imaging optics with a plurality of mirrors which image an object field in an object plane into an image field in an image plane,

- wherein, a reflection surface of at least one of the mirrors is a static free form surface which cannot be described by a rotationally symmetrical function,
- wherein the free form surface differs from an aspherical surface best adapted thereto, which can be described by a rotationally symmetrical function, in such a way, and
- wherein a normal to each free form surface element of a used region of the free form surface, which is configured to guide the imaging light, adopts an angle ($\alpha$) of a maximum of 70 µrad with a normal to a corresponding aspherical surface element of the aspherical surface.

According to the disclosure, it was recognised that the use of at least one static free form surface in the imaging optics significantly increases the degrees of freedom in the guidance of the imaging light by the imaging optics. A static free form surface is taken to mean a free form surface, which is not actively changed with respect to its shape during the projection use of the imaging optics. Of course, a static free form surface as a whole may be displaced for adjustment purposes. The free form surface is designed, proceeding from an aspherical reference surface, which can be described by a rotationally symmetrical function. The aspherical surface best adapted to the free form surface may coincide with the aspherical reference surface. The small normal angle according to the disclosure, in other words the small normal deviation, between the best adapted aspherical surface on the one hand, and the free form surface, on the other hand, leads to the fact that the free form surface has only small gradients of the deviation from the best adapted aspherical surface which can be described by a rotationally symmetrical function, so the free form surface according to the disclosure is still accessible for a surface check with a conventional checking structure. This then simplifies the production of the free form surface according to the disclosure. The maximum normal angle deviation may be 50 μrad, 35 μrad or even less. In particular, the angle deviations for all the mirrors of the imaging optics may be less than 35 μrad. If the imaging optics has a plurality of free form surfaces of this type, the angle deviation for individual ones of these free form surfaces may also be smaller than 30 μrad, smaller than 25 μrad or smaller than 20 μrad. The imaging optics may have precisely one free form surface of this type or else a plurality of free form surfaces of this type. Axes of rotational symmetry of the best adapted aspherical surfaces to the respective free form surface in the imaging optics do not have to coincide, but may be spaced apart from one another, may have an angle with respect to one another or may lie askew with respect to one another. The axis of rotational symmetry of the aspherical surface best adapted to the at least one free form surface may be perpendicular to the object plane and/or perpendicular to the image plane. This simplifies the surface checking of the at least one free form surface and facilitates the design of a checking optics involved for this. Deviations of the angle of the axis of rotational symmetry of the aspherical surface best adapted to the at least one free form surface with respect to the object plane and/or the image plane from a 90° angle are possible, for example in the range between 85° and 90°.

In some embodiments, an imaging optics can combine features of the above-noted aspects. In such embodiments, the imaging optics can combine advantages of these aspects.

In some embodiments, the free form surface deviates by more than the wavelength of the imaging light, for which the imaging optics is designed, from the aspherical surface which is best adapted thereto. In such embodiments, an arrow height or sagitta deviation by more than the wavelength of the imaging light can lead to the possibility of an adequate image error correction. The deviation is generally less than, for example, 50 μm and may be less than 3 μm. In particular, this deviation may be less than 3 μm for all free form surfaces of this type. This arrow height deviation may also be less than 2 μm or else less than 1 μm for individual free form surfaces.

An imaging optics with six mirrors leads to a particularly advantageous combination of the parameters noted above.

In some embodiments, the reflection surfaces of all the mirrors are form surfaces. In such embodiments, the degrees of design freedom, in particular to reduce imaging errors, but also, for example, for providing a specific field form, are advantageously large. The free form surfaces may all be configured according to the second aspect noted above. Alternatively, individual ones of the free form surfaces may also have greater angle deviations or else smaller or greater arrow height deviations, than described above.

In some embodiments, the imaging optics has a numerical aperture on the image side which is greater than 0.3. Such a numerical aperture can lead to a particularly high structure resolution of the imaging optics.

In some embodiments, the image field covers an area delimited by sides having an extent of at least 1 mm. Such an image field can lead to a good throughput of the imaging optics.

In some embodiments, an imaging optics has: a maximum wavefront error (rms) of 25 mλ, wherein λ is the wave-length of the imaging light; a maximum distortion of 1.1 nm; and/or a minimum telecentricity of 3 mrad. Such imaging parameters can lead to an advantageously precise imaging.

In some embodiments, the imaging optics is a projection optics for microlithography. Such embodiments can be particularly advantageous.

The advantages of an optical system according to the disclosure and a projection exposure installation according to the disclosure correspond to those which were listed above in relation to the imaging optics according to the disclosure. The light source of the projection exposure installation may be broad-band and, for example, have a bandwidth, which is greater than 1 nm, greater than 10 nm or greater than 100 nm. In addition, the projection exposure installation may be designed such that it can be operated with light sources of different wavelengths. Light sources for other wavelengths, particularly used for microlithography, can be used in conjunction with the imaging optics according to the disclosure, for example light sources with the wavelengths 365 nm, 248 nm, 193 nm, 157 nm, 126 nm, 109 nm and in particular also with wavelengths, which are less than 100 nm, for example between 5 nm and 30 nm.

The light source of the projection exposure installation can be configured to produce illumination light with a wavelength of between 5 nm and 30 nm. A light source of this type involves reflective coatings on the mirrors, which, in order to satisfy a minimum reflectivity, only have a small angle of incidence acceptance bandwidth. The desire for a small angle of incidence acceptance bandwidth can be satisfied together with the imaging optics according to the disclosure.

Corresponding advantages apply to a production method according to the disclosure and the microstructured or nanostructured component produced by this.

BRIEF DESCRIPTION OF THE DRAWINGS

Embodiments of the disclosure will be described in more detail below with the aid of the drawings, in which.

DETAILED DESCRIPTION

Figure 1:
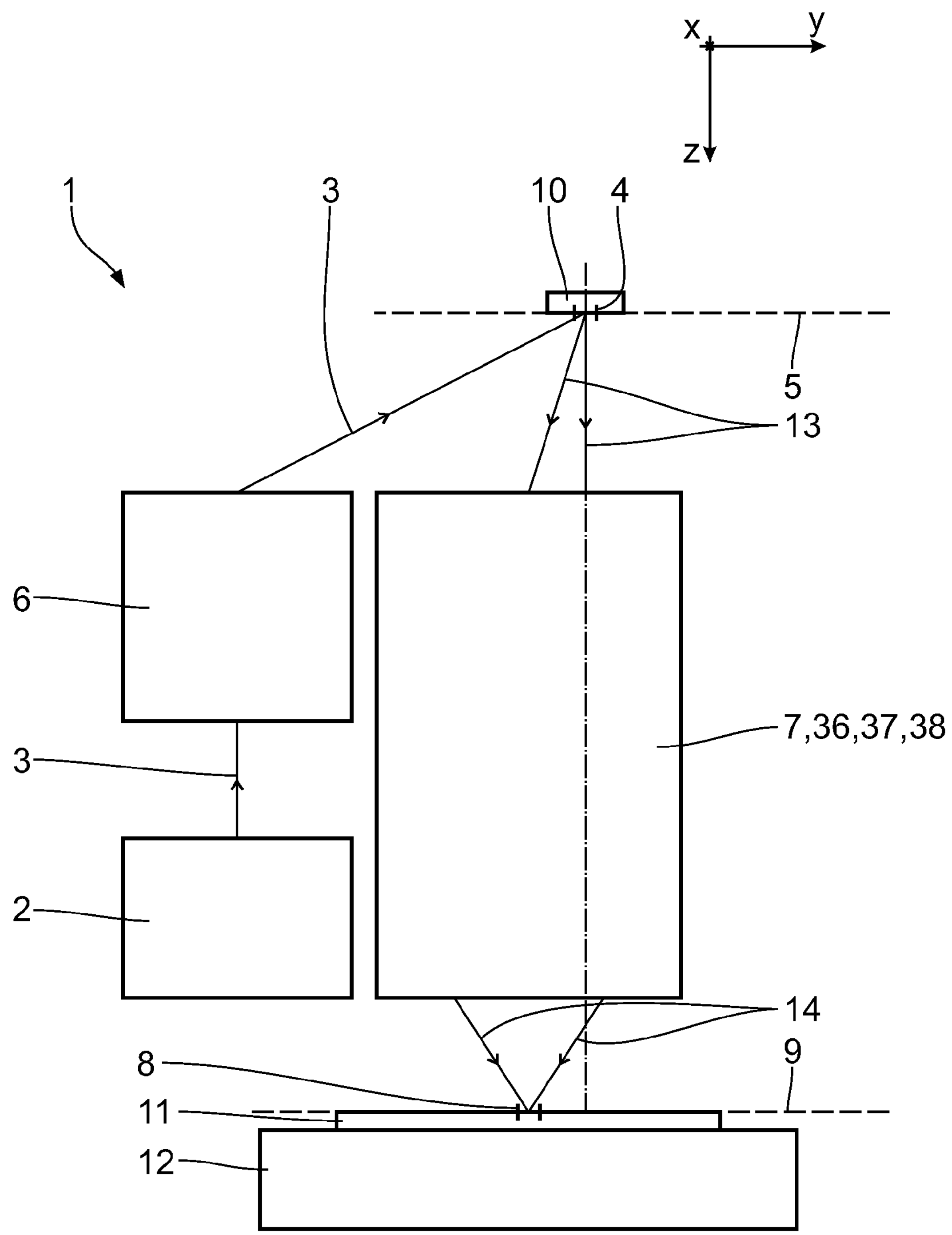
FIG. 1 schematically shows a projection exposure installation for EUV microlithography.

A projection exposure installation 1 for microlithography has a light source 2 for illumination light or illumination radiation 3. The light source 2 is an EUV light source, which produces light in a wavelength range, for example, between 5 nm and 30 nm, in particular between 5 nm and 10 nm. The light source 2 may, in particular, be a light source with a wavelength of 13.5 nm or a light source with a wavelength of 6.9 nm. Other EUV wavelengths are possible. In general, even any wavelengths, for example visible wavelengths or else other wavelengths, which may be used in microlithography and are available for suitable laser light sources and/or LED light sources (for example 365 nm, 248 nm, 193 nm, 157 nm, 129 nm, 109 nm) are possible for the illumination light 3 guided in the projection exposure installation 1. A beam path of the illumination light 3 is shown highly schematically in FIG. 1.

An illumination optics 6 is used to guide the illumination light 3 from the light source 2 toward an object field 4 (cf FIG. 6) in an object plane 5. The object field 4 is imaged in an image field 8 (cf FIG. 2) in an image plane 9 at a predetermined reduction scale using a projection optics or imaging optics 7. One of the embodiments shown in FIG. 2 or 7 to 9 can be used for the projection optics 7. The projection optics 7 according to FIG. 2 reduces by a factor of 4.

Other reduction scales are also possible, for example 5×, 6× or 8× or else reduction scales, which are greater than 8× or which are less than 4×, for example 2× or 1×. An imaging scale of 4× is particularly suitable for the illumination light 3 with an EUV wavelength, as this is a common scale for microlithography and allows a high throughput with a reasonable size of a reflection mask 10, which is also called a reticle and carries the imaging object. In addition, with an imaging scale of 4×, the structure size on the reflection mask 10 is adequately large to keep production and qualification outlay for the reflection mask 10 within limits. The image plane 9 in the projection optics 7 in the configurations according to FIG. 2*ff*., is arranged parallel to the object plane 5. A detail of the reflection mask 10 coinciding with the object field 4 is imaged here.

Figure 2:
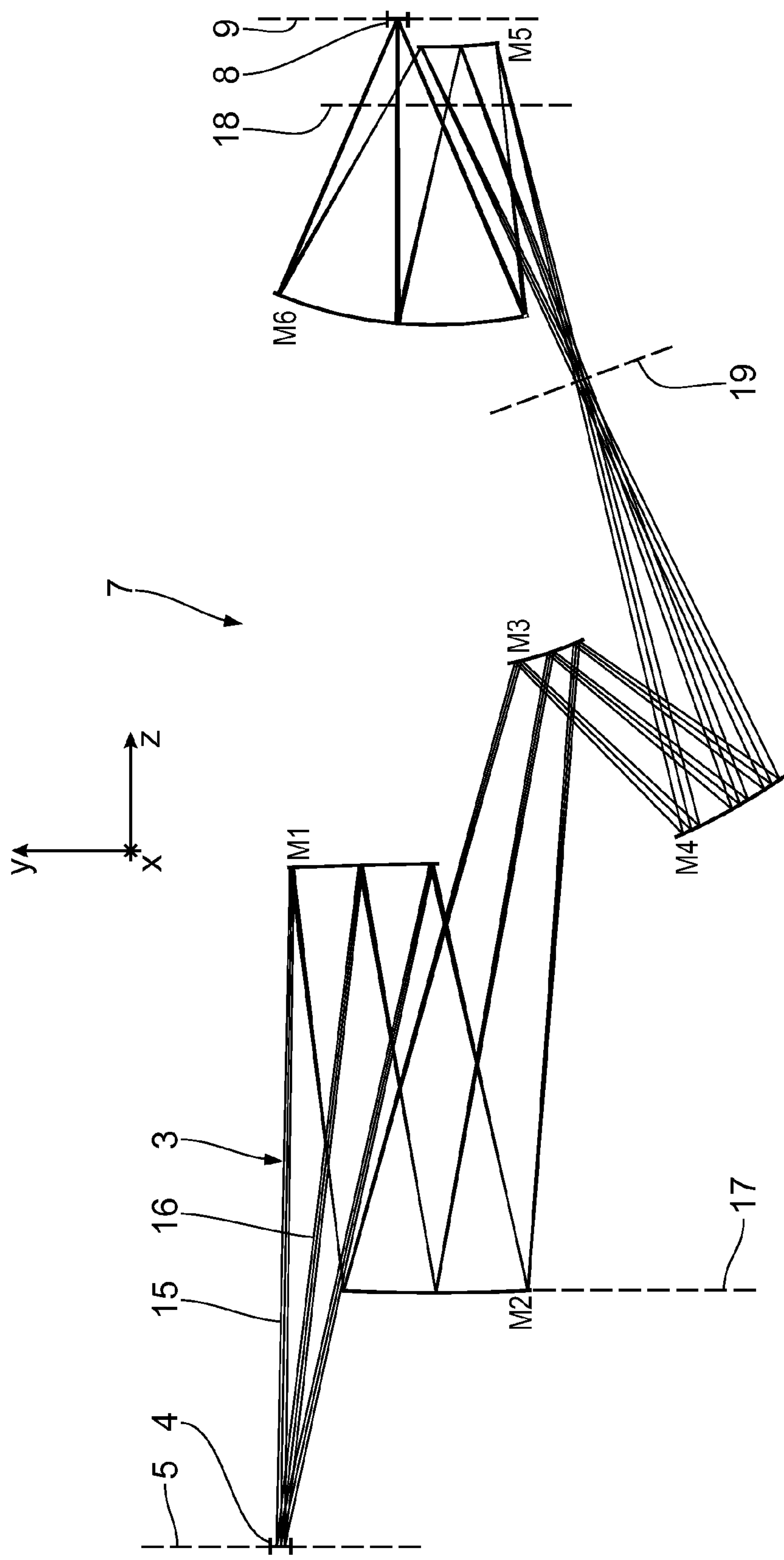
FIG. 2 shows an embodiment of an imaging optics of the projection exposure installation, shown in meridional section.

The imaging by the projection optics 7 takes place on the surface of a substrate 11 in the form of a wafer, which is carried by a substrate holder 12. FIG. 1 schematically shows, between the reticle 10 and the projection optics 7, a beam bundle 13 running therein of the illumination light 3 and, between the projection optics 7 and the substrate 11, a beam bundle 14 of the illumination light 3 coming from the projection optics 7. The illumination light 3 imaged by the projection optics 7 is also called imaging light. A numerical aperture on the image field side, of the projection optics 7 in the configuration according to FIG. 2 is 0.36. This is not shown to scale in FIG. 1.

To facilitate the description of the projection exposure installation 1 and the various configurations of the projection optics 7, a Cartesian xyz-coordinate system is given in the drawing, from which the respective position relationship of the components shown in the figures emerges. In FIG. 1, the x-direction runs perpendicular to the plane of the drawing and into it. The y-direction runs to the right and the z-direction downward.

The projection exposure installation 1 is of the scanner type. Both the reticle 10 and the substrate 11 are scanned during operation of the projection exposure installation 1 in the y-direction. A stepper type of the projection exposure installation 1, in which a stepwise displacement of the reticle 10 and the substrate 11 takes place in the y-direction between individual exposures of the substrate 11, is also possible.

FIG. 2 shows the optical design of a first embodiment of the projection optics 7. The beam path of three respective individual beams 15 is shown, which emanate from three object field points spaced apart from one another in the y-direction in FIG. 2. The three individual beams 15, which belong to one of these three object field points, are in each case associated with three different illumination directions for the three object field points. Main beams or chief rays 16 run through the centre of pupils in pupil planes 17, 18 of the projection optics 7. These chief rays 16 firstly run convergently, proceeding from the object plane 5. This is also called a positive back focus of an entry pupil of the projection optics 7 below. The entry pupil in the pupil plane 17 of the projection optics 7 according to FIG. 2 lies within the projection optics 7.

The projection optics 7 according to FIG. 2 has a total of six mirrors, which are numbered consecutively by M1 to M6 in the order of the imaging beam path of the individual beams 15, proceeding from the object field 4. Only the calculated reflection surfaces of the mirrors M1 to M6 are shown in FIG. 2. The mirrors M1 to M6 are generally larger than the actually used reflection surfaces.

The mirrors M1, M2, M4 and M6 are designed as concave mirrors. The mirrors M3 and M5 are designed as convex mirrors.

The mirrors M1 and M4, on the one hand, and the mirrors M3 and M6, on the other hand, are arranged back to back with regard to the orientation of their reflection surfaces.

The entry pupil plane 17 in the projection optics 7 according to FIG. 2 is located in the region of the mirror M2. An intermediate image plane 19 is located between the mirrors M4 and M5. The exit pupil plane 18 is located in the imaging beam path between the mirrors M5 and M6.

The optical data of the projection optics 7 according to FIG. 2 are shown below with the aid of a table divided into a plurality of sub-tables.

The precise shape of the individual reflection surfaces of the mirrors M1 to M6 is produced as the sum of a rotationally symmetrical reference asphere, which is also called a base asphere, and a free form term in the form of an XY-polynomial. The value Y is displaced as a function of the position of the respective mirror M1 to M6 by a decentring value Dy0, which is listed at the end of the second sub-table.

The rotationally symmetrical reference asphere can be selected such that it has a minimum deviation from the free form surface. In this case, the reference asphere is simultaneously a free form surface best adapted to the free form surface, i.e. a best fit asphere. The rotationally symmetrical reference sphere may also be selected differently, in other words does not have to coincide with the best adapted asphere.

The base asphere is calculated using the following asphere equation:

$$z = \frac{h^2 / RDY}{1 + \sqrt{1 - (1 + CCY)h^2 / RDY^2}} + \sum_{k=1}^{n} c_k h^k, \tag{1}$$

$$h = \sqrt{x^2 + y^2}$$

x and y designate here the coordinates on the base sphere, proceeding from a coordinate origin, which may also lie outside the used region of the face of the asphere. z designates an arrow height or a sagitta of the base asphere. RDY is the radius of the base asphere, in other words the inverse of the face curvature in the coordinate origin. CCY is a conical parameter.

The value "spacing" designates the spacing from the respective following component.

In the second following table the value "coefficient" designates the index k for the coefficient $c_k$ of the base sphere equation (1).

The following free form surface term is added:

$$z_F = \sum_{i=0}^{n} \sum_{j=0}^{n} a_{i,j} x^i \tilde{y}^j \tag{2}$$

$$\tilde{y} = y - Dy0$$

$z_F$ designates the arrow height or sagitta of the free form term relative to the reference asphere. The y-coordinate of the free form term is displaced by the decentring value Dy0 in relation to the y-coordinate of the reference asphere.

Projection optics 7

| | Object | M1 | M2 | M3 | M4 | M5 | M6 |
|---|---|---|---|---|---|---|---|
| Spacing [mm] | 726.546191 | −456.894259 | 662.640221 | −229.678071 | 892.995179 | −295.316873 | 325.045697 |
| RDY [mm] | | −2657.095896 | −1309.948227 | 308.461174 | −518.830174 | 396.693971 | −369.501481 |
| CCY | | −9.419257 | −4.39783 | −0.84874 | −0.143937 | −0.121327 | 0.101899 |

| Base asphere | coefficient | M1 | M2 | M3 | M4 | M5 | M6 |
|---|---|---|---|---|---|---|---|
| | 4 | 5.178979E−10 | −9.445613E−11 | 3.473074E−11 | 1.347509E−11 | 1.193632E−08 | 8.695903E−12 |
| | 6 | −4.244132E−15 | 5.132988E−16 | 8.581153E−15 | −5.814514E−16 | 7.415353E−13 | 9.285618E−16 |
| | 8 | −5.447933E−20 | 2.351217E−20 | 9.490453E−20 | 1.880124E−21 | 2.536115E−17 | −8.136730E−21 |
| | 10 | 3.012623E−24 | −1.046920E−24 | −2.448303E−23 | −7.376969E−27 | −4.169761E−21 | −9.744271E−26 |
| | 12 | −4.822565E−29 | 9.282073E−29 | 8.824884E−28 | 4.441271E−33 | 3.978086E−25 | −3.550219E−31 |
| | 14 | 4.538299E−34 | −3.285815E−33 | −9.408217E−33 | −2.646137E−38 | −2.219546E−29 | −4.812005E−36 |
| | Dy0 [mm] | 100.232448 | 101.124629 | −134.314784 | −243.466088 | 12.469543 | −44.338695 |

| Polynomial coefficient | | | | | | | |
|---|---|---|---|---|---|---|---|
| x**i | y**j | M1 | M2 | M3 | M4 | M5 | M6 |
| 2 | 0 | −4.975692E−09 | 9.695091E−08 | −2.068596E−08 | 3.206746E−08 | −2.276394E−09 | −1.165903E−07 |
| 0 | 2 | 2.217941E−07 | −2.139894E−07 | −1.985746E−06 | −4.154570E−07 | −2.120053E−06 | 9.109341E−08 |
| 2 | 1 | 2.157083E−09 | −5.373358E−10 | 8.663064E−09 | 2.154247E−09 | −4.318311E−08 | −3.116219E−09 |
| 0 | 3 | 7.267837E−10 | −5.557376E−09 | 1.269693E−07 | −6.469982E−09 | −9.288793E−08 | −2.838594E−09 |
| 4 | 0 | 1.006508E−11 | −9.179722E−13 | −2.044162E−11 | −1.830354E−12 | −2.594418E−10 | 1.838258E−11 |
| 2 | 2 | −2.992633E−11 | −1.208218E−11 | −1.035844E−09 | 5.107694E−11 | −1.023004E−09 | 1.355483E−11 |
| 0 | 4 | −3.802254E−11 | −4.600202E−11 | −3.316814E−09 | −1.169717E−11 | −1.086314E−09 | −3.924079E−12 |
| 4 | 1 | −2.427238E−13 | −9.866594E−14 | 3.738932E−12 | −1.137776E−13 | 1.393821E−11 | 2.723046E−13 |
| 2 | 3 | −5.884727E−13 | 1.904195E−13 | 3.272532E−11 | 2.570044E−13 | −7.876769E−12 | 5.060127E−13 |
| 0 | 5 | −7.669692E−13 | −1.776355E−15 | 4.078071E−11 | −4.386599E−14 | 5.435682E−12 | 2.507825E−13 |
| 6 | 0 | −4.725637E−16 | −5.822574E−16 | −4.223264E−15 | 7.671818E−17 | 8.259254E−14 | −9.846481E−16 |
| 4 | 2 | −9.377688E−16 | −8.947838E−16 | −1.670063E−13 | −1.262538E−15 | 4.767567E−13 | −2.507283E−15 |
| 2 | 4 | −1.093999E−14 | 5.980286E−15 | −4.753590E−13 | −1.081585E−15 | −1.341930E−13 | −2.059553E−15 |
| 0 | 6 | −1.130552E−14 | 2.933843E−15 | −1.251603E−13 | −4.700974E−15 | 1.856171E−13 | −6.728585E−16 |
| 6 | 1 | 2.089697E−19 | −8.672543E−18 | 4.093189E−16 | 2.108881E−18 | −3.109520E−16 | −3.705879E−18 |
| 4 | 3 | −9.698939E−17 | 1.104895E−17 | 2.996991E−15 | 1.197042E−18 | 5.095266E−15 | −1.083421E−17 |
| 2 | 5 | −1.441666E−16 | 5.353036E−17 | 2.237381E−15 | 8.903388E−18 | −5.149099E−16 | −1.100985E−17 |
| 0 | 7 | −9.511112E−17 | 2.316729E−17 | −2.163136E−15 | −2.029320E−17 | 4.893582E−16 | −3.109613E−18 |
| 8 | 0 | 4.163935E−21 | −4.301217E−21 | −4.053853E−19 | −9.852267E−22 | −6.324693E−18 | 1.045914E−20 |
| 6 | 2 | −5.479642E−19 | −1.087286E−20 | −9.376184E−18 | 5.922201E−21 | −5.292930E−17 | 4.748588E−20 |
| 4 | 4 | −1.224810E−18 | 1.503390E−19 | −1.881787E−17 | 1.497284E−20 | 2.260813E−17 | 7.452319E−20 |
| 2 | 6 | −7.792058E−19 | 2.126832E−19 | 1.017139E−17 | 1.232874E−19 | 2.186881E−17 | 5.522350E−20 |
| 0 | 8 | −3.893532E−19 | 7.971168E−20 | 1.912450E−17 | 1.260944E−19 | −1.638439E−17 | 1.367445E−20 |
| 8 | 1 | −1.191724E−21 | 1.554855E−22 | 1.261381E−20 | −1.053922E−23 | 2.437118E−19 | −2.420841E−23 |
| 6 | 3 | −3.467498E−21 | 2.961693E−22 | 4.413801E−20 | −3.702805E−23 | 1.053665E−20 | −1.053577E−22 |
| 4 | 5 | −4.170109E−21 | 5.479512E−22 | 3.143391E−20 | −9.285155E−23 | 6.495759E−19 | −1.513860E−22 |
| 2 | 7 | −2.315023E−21 | 3.526402E−22 | −9.832357E−20 | 2.607107E−22 | 4.039514E−19 | −1.127630E−22 |
| 0 | 9 | −1.081246E−21 | 1.130604E−22 | −2.675396E−20 | 7.342690E−22 | −3.223068E−20 | −2.859206E−23 |
| 10 | 0 | −1.494728E−24 | 0.000000E+00 | 0.000000E+00 | 0.000000E+00 | 2.673763E−21 | 5.921034E−26 |

-continued

| Polynomial coefficient | | | | | | | |
|---|---|---|---|---|---|---|---|
| x**i | y**j | M1 | M2 | M3 | M4 | M5 | M6 |
| 8 | 2 | −2.399468E−24 | 0.000000E+00 | 0.000000E+00 | 0.000000E+00 | 1.109963E−20 | 3.181614E−25 |
| 6 | 4 | 2.272489E−25 | 0.000000E+00 | 0.000000E+00 | 0.000000E+00 | 1.578440E−20 | 6.417671E−25 |
| 4 | 6 | −4.456038E−24 | 0.000000E+00 | 0.000000E+00 | 0.000000E+00 | 1.342665E−20 | 6.335341E−25 |
| 2 | 8 | −4.794566E−24 | 0.000000E+00 | 0.000000E+00 | 0.000000E+00 | 4.953590E−21 | 3.298387E−25 |
| 0 | 10 | −2.459538E−24 | 0.000000E+00 | 0.000000E+00 | 0.000000E+00 | 1.330302E−21 | 7.192177E−26 |

The various embodiments of the projection optics 7 shown in the figures and the further configurations of projection optics described below are shown with an unfolded imaging beam path. It is obvious that further folding mirrors can also be accommodated in the beam path between the mirrors M1 to M6, depending on the desired installation space properties to accommodate the respective projection optics 7. Only the unfolded imaging beam paths will be observed below.

As becomes clear from the above table, all the six mirrors M1 to M6 of the projection optics 7 are designed as free form surfaces which cannot be described by a rotationally symmetrical function. Other configurations of the projection optics 7 are also possible, in which at least one of the mirrors M1 to M6 has a free form reflection surface of this type. At least one reflection surface is designed here as a static free form surface which cannot be described by a rotationally symmetrical function and whose form cannot be changed in operation or in operating breaks of the projection exposure installation 1, in other words cannot be changed in a selective manner with respect to its form.

Figure 3:
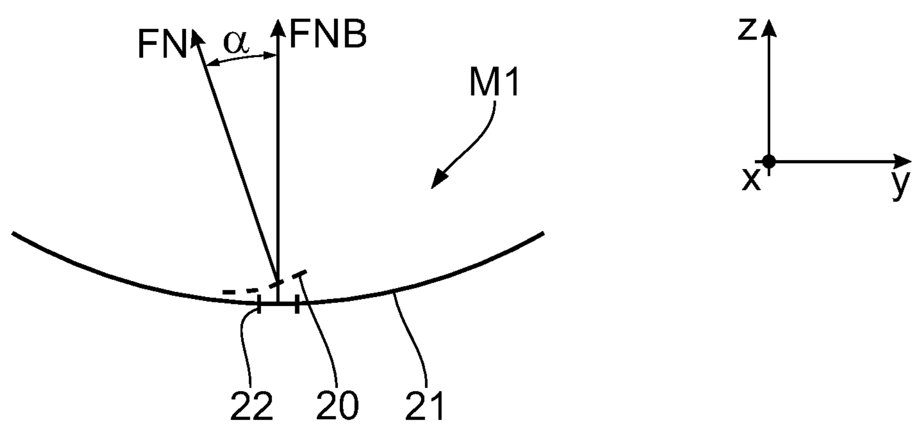
FIG. 3 shows a section through a face element of a non-rotationally symmetrical free form surface and through a rotationally symmetrical best adapted surface in the form of an aspherical surface, an aspherical surface element corresponding to the free form surface element being characterised.

FIG. 3 shows, in a highly schematic view which is greatly exaggerated with regard to the deviation shown, a free form surface element 20 of a used region of the free form surface, for example of the mirror M1, which is configured to guide the imaging light 3. In addition, FIG. 3 shows an aspherical surface 21 which is best adapted to the free form surface and can be described by a rotationally symmetrical function, for example by the asphere equation already described above.

FIG. 3 shows a normal FNB to the best adapted aspherical surface 21 in the region of an asphere surface element 22 around the coordinates $x_0$, $y_0$ of the observed free form surface element 20, in other words the normal FNB to the asphere surface element 22 corresponding to the free form surface element 20. Proceeding from the same coordinates $x_0$, $y_0$, in relation to the arrow height z, but proceeding from the free form surface element 20, a normal FN to the free form surface element 20 is also shown in FIG. 3. The two normals FNB and FN enclose an angle α with respect to one another of a maximum of 70 μrad. This maximum deviation applies to each pair of free form surface elements and asphere surface elements corresponding thereto over the entire used regions of the free form surfaces of the mirrors M1 to M6. These used regions are also called useful surfaces. The optically used regions of all the mirrors M1 to M6 do not have a through-opening for the passage of the imaging light 3, in other words are not obscured.

Figure 4:
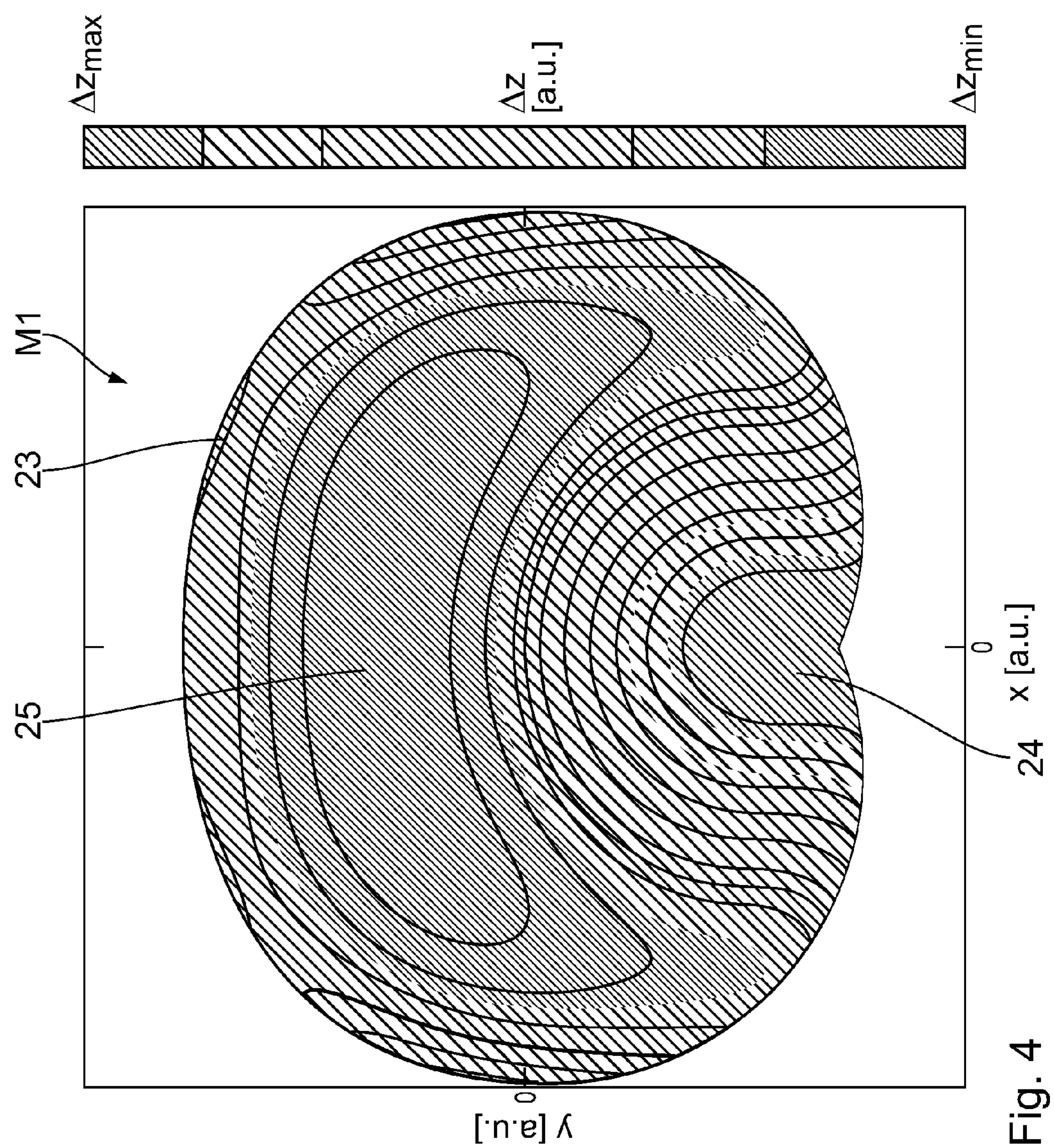
FIG. 4 shows a highly enlarged plan view of a used region of a reflection surface, configured as a free form surface, of the first mirror in the imaging beam path of the imaging optics according to FIG. 2, the deviation of the free form reflection surface from the best adapted aspherical surface, which can be described by a rotationally symmetrical function, being shown by contour lines and hatchings associated with the size of the deviation.

FIG. 4 shows an arrow height or sagitta deviation Δz of the used region 23 of the free form surface of the mirror M1, which approximately has the basic form of a bean or kidney. Thus, the deviation of the z-value of the basic asphere from the z-value of the actually used free form surface is shown at the respectively observed x-y-point.

In the region of a constriction 24 of the used region 23, in other words at the smallest y-values and at average x-values of the used region 23, the arrow height deviation of the free form surface from the best adapted aspherical surface is maximal and is about 0.5 μm there. Everywhere else the arrow height deviation over the used region 23 is smaller and is close to 0 in a large region 25, which extends in an arcuate manner around the constriction 24.

The free form surface deviates from the best adapted aspherical surface therefore, if wavelengths of the illumination or imaging light 3 are used that are less than 500 nm, by a maximum of more than the wavelength of the imaging light 3.

Figure 5:
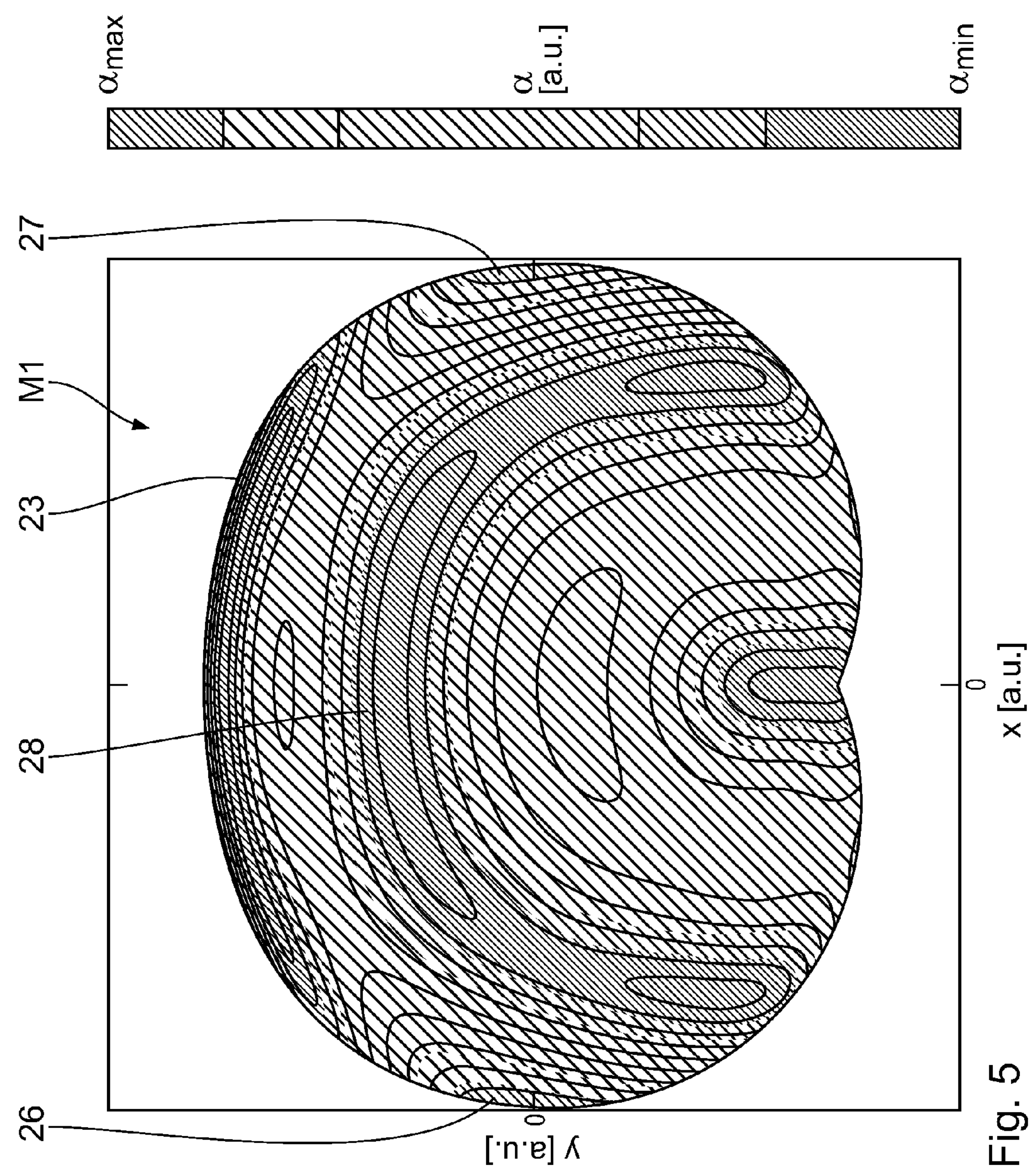
FIG. 5 shows a gradient of the deviation of the free form reflection surface of the first mirror from the best adapted aspherical surface in a view similar to FIG. 4.

FIG. 5 also shows for the used region 23 of the mirror M1, the maximum angle deviation of the two normals FN, FNB from one another. This angle deviation is maximal at maximal and at minimal x-values in two opposing edge regions 26, 27 of the used region 23 and is about 15 μrad there. Everywhere else, the angle is smaller between the normals FN, FNB, in other words a maximal gradient of the deviation of the free form surface from the best adapted aspherical surface and is in turn close to 0 in the region of the constriction 24 and in an arcuate region 28 extending slightly more narrowly in comparison to the arcuate region 25 of FIG. 4, around the constriction 24.

Figure 6:
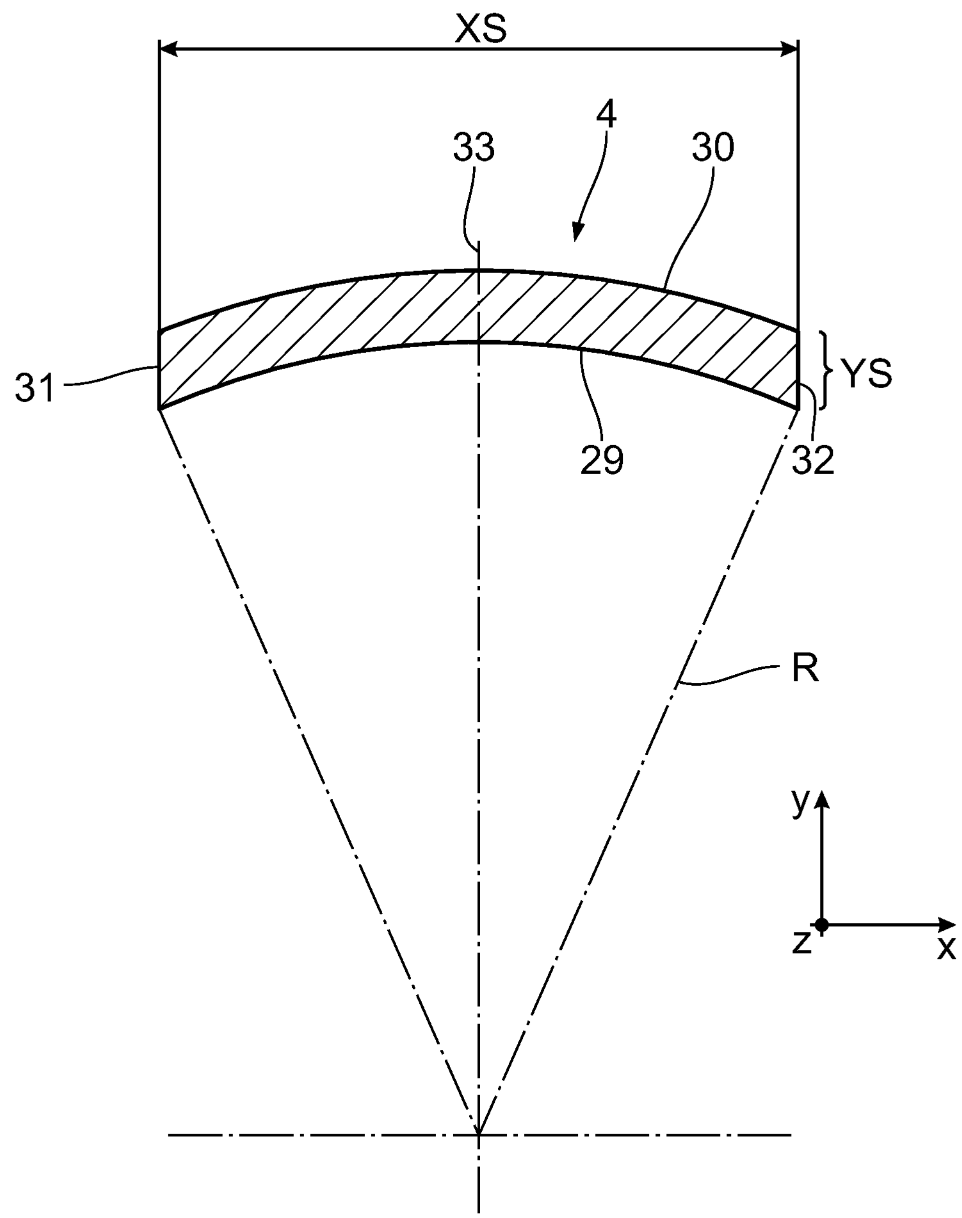
FIG. 6 shows, enlarged, an object field of the imaging optics according to FIG. 2.

FIG. 6 shows, enlarged and by way of example, the form of the object field 4 of the projection optics 7. The image field, apart from the fact that it is reduced, has precisely the same form. The field 4 has the shape of an arched field, which is limited by two part circles 29, 30. The inner of the two part circles, the part circle 29 has a radius R. In addition, the field 4 is limited by two limit lines 31, 32 which connect the two ends of the part circles 29, 30 in each case and extend parallel to a normal 33 extending parallel to the y-axis. The two limit lines 31, 32 have a spacing XS with respect to one another, the so-called scan slot width. The two part circles 29, 30 have a spacing with respect to one another of YS, the so-called scan slot length.

The image field 8 in the projection optics 7 according to FIG. 2 has the dimensions XS=26 mm (scan slot width) and YS=2 mm (scan slot length).

Figure 7:
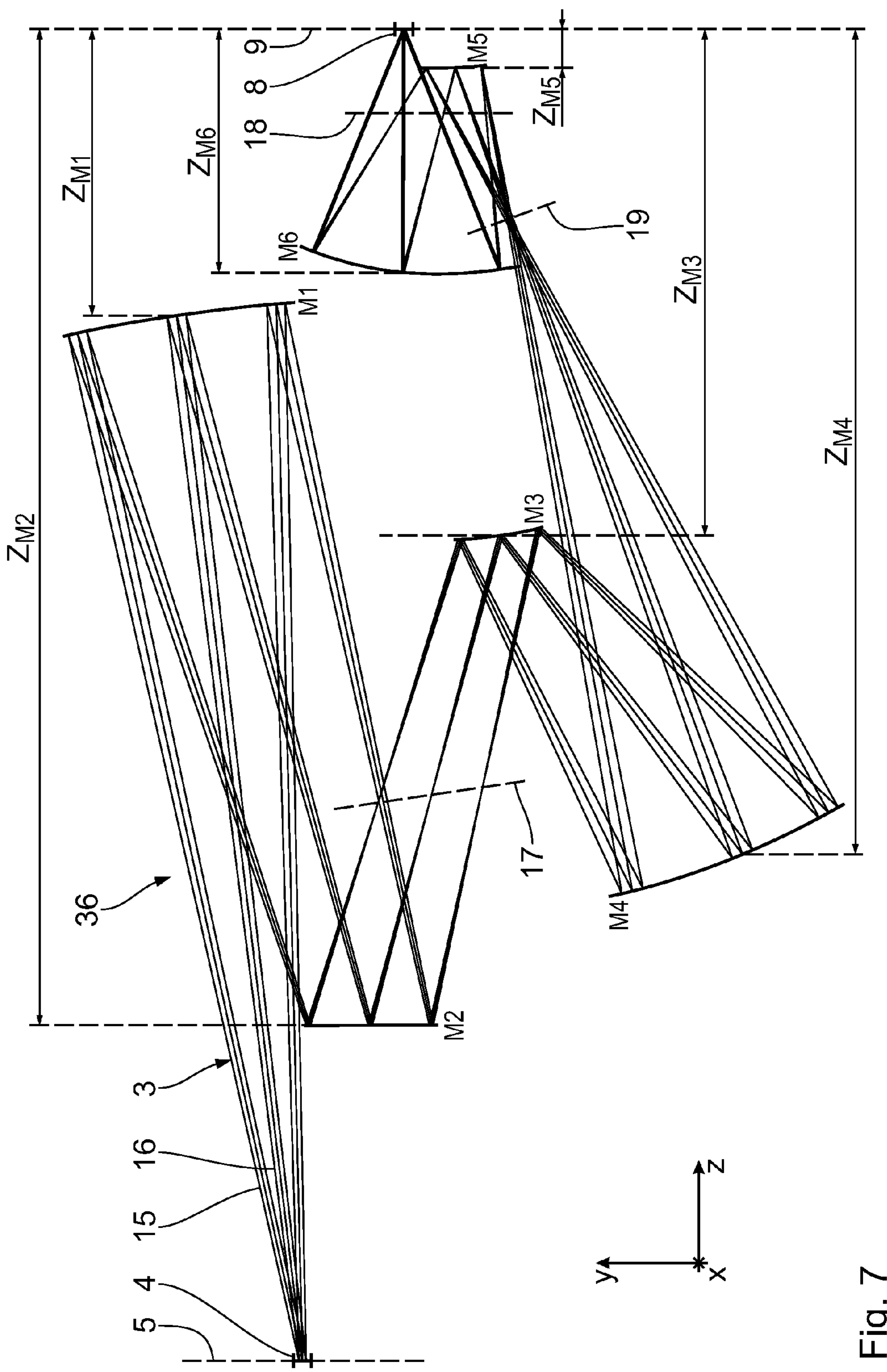
FIGS. 7 to 11 shows further embodiments of imaging optics for the projection exposure installation according to FIG. 1 in a view similar to FIG. 2.

With the aid of FIG. 7, a further projection optics 36 is described, which can be used instead of the projection optics 7 in the projection exposure installation 1. Components of the projection optics 36, which correspond to those which have already been described above with reference to the projection optics 7, have the same designations and reference numerals and will not be discussed in detail again.

The mirrors M1, M4 and M6 are designed as concave mirrors. The mirrors M2, M3 and M5 are designed as convex mirrors.

The mirrors M1 and M6 and also the mirrors M3 and M6 are, with regard to the orientation of their reflection surfaces, arranged back to back.

A first pupil plane 17 located within the projection optics 36, in the projection optics 36, lies between the mirrors M2 and M3. The projection optics 26 has a negative back focus of the entry pupil plane, in other words the chief rays 16 of the individual field points extend divergently with respect to one another from the object field 4 into the projection optics 36. The entry pupil in the projection optics is thus not located in the pupil plane 17, but in the imaging beam path before the object field 4. This, for example, allows a pupil component of the illumination optics 6 in the entry pupil of the projection optics 7 to be arranged in the beam path before the projection optics 36, without further imaging optical components having to be present between this pupil component and the object plane 5. The intermediate image plane 19 is located closer to the image field 8 than the mirror M6 in the imaging beam path between the mirrors M4 and M5.

In the unfolded imaging beam path in turn shown, an impingement point of a chief ray 16, which belongs to a central object field point, on a useful face 23 of each of the mirrors M1 to M6, which is configured to guide the imaging light 3, has a mirror spacing $z_{M1}$ to $z_{M6}$ from the image plane 9. The mirror spacing $z_{M1}$ of the first mirror M1 is greater than the mirror spacing $z_{M6}$ of the last mirror M6. The mirror spacing $z_{M3}$ of the fourth to last mirror M3 is greater than the mirror spacing $z_{M1}$ of the first mirror M1. In total, the following relation applies to the mirror spacings $z_M$ of the six mirrors M1 to M6 of the projection optics 36:

$$z_{M2}>z_{M4}>z_{M3}>z_{M1}>z_{M6}>z_{M5}.$$

The optical data of the projection optics 36 according to FIG. 7 will be shown below with the aid of a table, which, corresponding to the table with regard to the projection optics 7 according to FIG. 2, is divided into several sub-tables.

The value designated "y-decentration" in the first of these sub-tables gives a displacement of a local coordinate system of the respective surface in the y-coordinate direction with respect to a global coordinate system. This value equals 0 in the projection optics 7 according to FIG. 2.

With reference to the other parameters given in the following table that which was already described above in relation to the table of the projection optics 7 according to FIG. 2 applies.

| Projection optics 36 | | | | | | | |
|---|---|---|---|---|---|---|---|
| | Object | M1 | M2 | M3 | M4 | M5 | M6 |
| Spacing [mm] | 1356.315679 | −928.324671 | 618.200530 | 476.927052 | 1078.190306 | −62.270746 | 312.742187 |
| y-decentration [mm] | | 0.277662 | 5.410883 | −0.234369 | −0.275237 | −0.582889 | −0.570380 |
| RDY [mm] | | −1716.921675 | 34958.561285 | 393.812987 | −785.353033 | 450.319326 | 341.120076 |
| CCY | | −0.287468 | 0.000000 | 1.335177 | −0.068232 | 30.859253 | 0.017799 |

| Base asphere | Coefficient | M1 | M2 | M3 | M4 | M5 | M6 |
|---|---|---|---|---|---|---|---|
| | 4 | −1.408230E−11 | 6.024356E−10 | −6.864293E−09 | −1.002174E−11 | −3.275306E−08 | −1.891707E−10 |
| | 6 | −8.849630E−18 | −9.468346E−15 | 1.246159E−14 | 2.170292E−18 | −2.152212E−12 | 3.518708E−15 |
| | 8 | −4.882101E−23 | 3.388005E−19 | −2.501465E−18 | −5.697434E−23 | −3.904857E−16 | −3.019318E−19 |
| | 10 | 1.345168E−28 | −3.858425E−24 | 1.736902E−23 | −2.694132E−28 | −4.741404E−20 | 5.105580E−24 |
| | 12 | 1.374499E−34 | −1.722778E−28 | 4.041016E−28 | 1.464398E−33 | 6.561985E−24 | 1.951423E−30 |
| | 14 | 9.641707E−41 | 6.161954E−33 | 3.862421E−32 | −3.590433E−39 | −2.788451E−27 | −1.402398E−34 |
| | 16 | −2.047917E−45 | −7.551910E−38 | −8.001276E−37 | 3.626456E−45 | 3.200385E−32 | 2.099771E−39 |
| | Dy0 [mm] | 0.000000 | 0.000000 | 0.000000 | 0.000000 | 0.000000 | 0.000000 |

| Polynomial coefficient | | | | | | | |
|---|---|---|---|---|---|---|---|
| x**i | y**j | M1 | M2 | M3 | M4 | M5 | M6 |
| 0 | 1 | 2.652002E−05 | −1.596852E−05 | −3.437193E−06 | −6.705815E−05 | −1.085347E−05 | 1.812496E−05 |
| 2 | 0 | −1.725958E−07 | 2.655796E−07 | −2.280212E−07 | −1.507958E−07 | −9.057598E−07 | −2.692417E−07 |
| 0 | 2 | −7.091073E−07 | 7.743042E−07 | 2.233689E−07 | −9.042024E−07 | 4.422312E−07 | −1.768434E−08 |
| 2 | 1 | 8.009185E−09 | −2.592814E−09 | 6.577436E−08 | 7.122951E−11 | 3.645215E−08 | −1.483173E−09 |
| 0 | 3 | 5.359476E−09 | −6.633029E−09 | −1.747652E−08 | −4.366138E−09 | 2.471176E−08 | −2.326908E−09 |
| 4 | 0 | 4.881421E−12 | −7.391919E−11 | 5.473399E−10 | −1.834283E−13 | 1.445332E−09 | 5.484086E−11 |
| 2 | 2 | −7.726708E−11 | −6.929747E−11 | 1.438555E−09 | 1.749795E−11 | 1.413111E−09 | 9.517529E−11 |
| 0 | 4 | −1.792725E−11 | 5.605805E−11 | −8.242427E−10 | −1.218513E−11 | −9.354116E−11 | 3.150267E−11 |
| 4 | 1 | −1.902882E−13 | −3.212063E−13 | 7.032131E−13 | −1.981697E−14 | −1.439426E−11 | 1.717959E−14 |
| 2 | 3 | 3.788304E−13 | −8.240834E−13 | −8.002049E−12 | 1.044376E−13 | −3.942791E−11 | 5.639687E−14 |
| 0 | 5 | 2.959889E−14 | −2.111520E−12 | −8.633208E−12 | −2.532397E−14 | −1.397290E−11 | 8.391126E−14 |
| 6 | 0 | 1.520990E−17 | 8.375214E−15 | −4.934897E−14 | −9.772679E−18 | −5.772331E−13 | −5.305071E−15 |
| 4 | 2 | 1.999437E−15 | 2.116584E−14 | −2.219859E−13 | −1.565408E−16 | −1.676759E−12 | −1.613675E−14 |
| 2 | 4 | −8.938271E−16 | 2.809256E−14 | −5.262432E−13 | 3.345870E−16 | −8.462602E−13 | −1.624179E−14 |
| 0 | 6 | −4.953370E−17 | 2.937112E−14 | 3.125521E−14 | −1.999525E−17 | −1.041777E−12 | −5.130581E−15 |
| 6 | 1 | −3.335168E−19 | 1.784796E−18 | −6.343657E−16 | 1.589946E−19 | −2.359947E−15 | 6.284110E−19 |
| 4 | 3 | −1.101294E−17 | 1.618924E−16 | −3.901431E−15 | −2.785918E−19 | −7.784788E−15 | 1.397593E−18 |
| 2 | 5 | −3.329915E−19 | −8.774207E−17 | −8.173622E−15 | 7.434919E−19 | −1.612413E−14 | 2.233663E−18 |
| 0 | 7 | 2.115986E−19 | −1.217160E−16 | 7.825951E−16 | 2.428038E−20 | −2.535791E−14 | −2.313536E−18 |
| 8 | 0 | 1.016609E−22 | −3.243062E−19 | 1.244768E−18 | 5.637623E−23 | 4.498359E−17 | 2.839814E−19 |
| 6 | 2 | 2.593164E−21 | −1.635372E−18 | −1.713043E−17 | 9.881365E−22 | 2.542564E−16 | 1.136167E−18 |

-continued

| Polynomial coefficient | | | | | | | |
|---|---|---|---|---|---|---|---|
| x**i | y**j | M1 | M2 | M3 | M4 | M5 | M6 |
| 4 | 4 | 3.391745E−20 | −5.054504E−18 | −6.220886E−17 | −3.087058E−22 | 7.546703E−16 | 1.705338E−18 |
| 2 | 6 | 7.025408E−21 | −1.224294E−18 | −8.771769E−17 | 5.458546E−22 | −2.969976E−16 | 1.143432E−18 |
| 0 | 8 | −6.442917E−22 | −1.718016E−19 | −2.429636E−18 | −1.499411E−22 | −8.630941E−17 | 2.991737E−19 |
| 8 | 1 | −5.909824E−25 | 1.075424E−21 | −5.440040E−20 | −2.128704E−25 | 1.250494E−18 | −2.100928E−24 |
| 6 | 3 | −7.296016E−24 | 6.844448E−21 | −3.861233E−19 | 8.344796E−25 | 5.880954E−18 | −3.411262E−24 |
| 4 | 5 | −5.408368E−23 | 2.693459E−20 | −6.891243E−19 | −1.924869E−24 | 2.228818E−17 | 7.493603E−23 |
| 2 | 7 | −1.436516E−23 | 6.017574E−21 | −6.093872E−19 | −1.408585E−24 | −1.133337E−18 | −6.987009E−23 |
| 0 | 9 | 1.036977E−24 | 9.193294E−22 | −7.585278E−20 | −6.857421E−25 | −2.433092E−19 | −7.390355E−23 |
| 10 | 0 | 1.029657E−29 | 4.405295E−24 | −7.533669E−23 | −1.064870E−28 | −4.243633E−21 | −5.302260E−24 |
| 8 | 2 | 4.081603E−28 | 1.947887E−23 | −7.152847E−22 | −1.104144E−27 | −2.293436E−20 | −2.657223E−23 |
| 6 | 4 | 6.321203E−27 | 2.376770E−23 | −2.286702E−21 | −1.241966E−27 | −2.061637E−20 | −5.314817E−23 |
| 4 | 6 | 3.416848E−26 | −2.515983E−23 | −2.802700E−21 | −3.168999E−27 | 1.305395E−19 | −5.355905E−23 |
| 2 | 8 | 9.307103E−27 | 3.506467E−24 | −1.799230E−21 | −2.179495E−27 | −2.473821E−20 | −2.645433E−23 |
| 0 | 10 | −7.302620E−28 | 3.862077E−24 | −2.870755E−22 | −6.492647E−28 | −3.110450E−20 | −5.133642E−24 |

The reflection surfaces of the mirrors M1 to M6 of the projection optics 36 are also configured as free form surfaces, to the deviations of which from the best adapted aspheric surface in relation to the arrow height deviation, on the one hand, and with regard to the normal angle deviation, on the other hand, that which was already stated above in conjunction with the projection optics 7 according to FIG. 2 applies correspondingly. The mirror M1 of the projection optics 36, for example, has a maximum arrow height deviation of 1.01 μm and a maximum angle deviation of 1.14 μrad.

The image field 8 of the projection optics 36 is also a ring field with an extent of 26 mm in the x-direction and of 2.5 mm in the y-direction.

Figure 8:
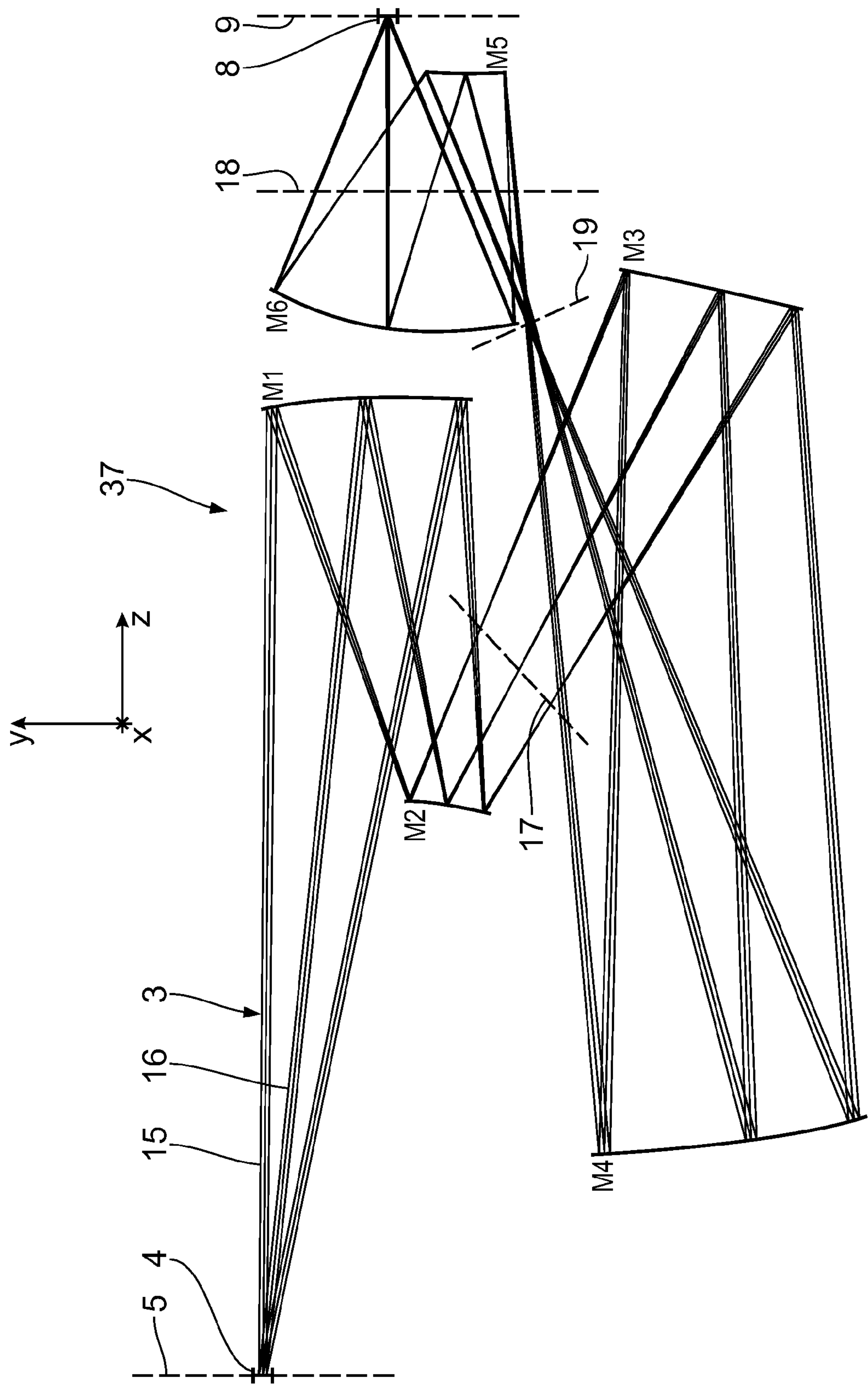

With the aid of FIG. 8, a further projection optics 37 is described, which can be used instead of the projection optics 7 in the projection exposure installation 1. Components of the projection optics 37, which correspond to those which were already described above in relation to the projection optics 7 have the same designations and reference numerals and will not be discussed again in detail.

The mirrors M1, M4 and M6 are designed as concave mirrors. The mirrors M2 and M5 are designed as convex mirrors. The mirror M3 is configured virtually as a planar mirror but is no flat folding mirror.

The mirrors M1 and M6 are arranged back to back with regard to the orientation of their reflection surfaces.

A first pupil plane 17 located within the projection optics 37, in the projection optics 37, is located between the mirrors M2 and M3. The projection optics 37 has a negative back focus of the entry pupil. The entry pupil in the projection optics 37 is therefore not located in the pupil plane 17, but in the imaging beam path before the object field 4. The intermediate image plane 19 is located in the imaging beam path between the mirrors M4 and M5 directly next to the mirror M6.

The surface description of the reflection surfaces of the mirrors M1 to M6 of the projection optics 37 takes place according to the following free form surface formula:

$$z = \frac{x^2/RDX + y^2/RDY}{1 + \sqrt{1 - (1 + CCX)x^2/RDX^2 - (1 + CCY)y^2/RDY^2}} + \sum_{i=0}^{n}\sum_{j=0}^{n} a_{i,j} x^i y^j \quad (3)$$

x and y in this case designate the coordinates on the respective surface. The local coordinate systems are in this case displaced with respect to a global reference system in the y-coordinate direction and tilted about the x-axis.

z designates the arrow height or sagitta of the free form surface in the respective local surface coordinate system. RDX and RDY are the radii of the free form surface in the xz- and in the yz-section, in other words the inverses of the respective surface curvatures in the coordinate origin. CCX and CCY are conical parameters.

The polynomial coefficients given in the second following sub-table are the coefficients $a_{i,j}$.

| Projection optics 37 | | | | | | | |
|---|---|---|---|---|---|---|---|
| | Object | M1 | M2 | M3 | M4 | M5 | M6 |
| Spacing | 1330.69385 | −557.627303 | 708.243742 | −1142.85285 | 1430.866193 | −351.192399 | 430.425369 |
| y-decentration [mm] | | −189.153638 | −271.278827 | −593.835308 | −766.851306 | −277.066725 | 259.250977 |
| x-tilt [°] | | −0.068634 | 10.892544 | 12.747514 | −11.95434 | 0.995543 | −2.191898 |
| RDX [mm] | | −1070.871391 | 378.073494 | −1300.303855 | −1899.56342 | 199.567522 | 452.627131 |
| RDY [mm] | | −976.69765 | −690.047429 | −917.175204 | 7743.717633 | 202.531238 | 443.435387 |
| CCX | | 0 | 0 | 0 | 0 | 0 | 0 |
| CCY | | 0 | 0 | 0 | 0 | 0 | 0 |

| Polynomial coefficient | | | | | | | |
|---|---|---|---|---|---|---|---|
| x**i | y**j | M1 | M2 | M3 | M4 | M5 | M6 |
| 2 | 0 | 7.651793E−06 | −3.785153E−04 | 2.879773E−04 | −2.868417E−05 | −1.635862E−03 | 6.086975E−05 |
| 0 | 2 | 5.371476E−05 | 1.737947E−03 | 4.733410E−04 | −3.507888E−04 | −1.692949E−03 | 8.446692E−05 |
| 2 | 1 | 1.528780E−08 | 7.635459E−07 | −1.466654E−07 | −3.520507E−10 | 1.761890E−06 | −9.657166E−08 |
| 0 | 3 | −2.033494E−09 | 1.096626E−06 | −4.802219E−08 | −3.350169E−09 | 3.860919E−07 | −1.773111E−08 |
| 4 | 0 | 8.724018E−12 | −1.715400E−10 | −4.158718E−11 | −1.483351E−12 | −1.174518E−08 | 1.345443E−10 |
| 2 | 2 | 5.339897E−11 | 2.367333E−09 | 1.583325E−10 | −6.032420E−11 | −1.926549E−08 | 3.881972E−10 |
| 0 | 4 | 4.470798E−11 | 3.803124E−09 | 1.267599E−10 | −2.797153E−11 | −1.069009E−08 | 2.103339E−10 |
| 4 | 1 | 6.471511E−15 | 5.213579E−12 | −2.647019E−13 | 3.326177E−15 | 1.846376E−11 | −4.424293E−13 |
| 2 | 3 | −1.998756E−14 | 4.308265E−11 | −2.044010E−13 | 1.601139E−14 | 4.345954E−11 | −5.340721E−13 |
| 0 | 5 | 2.392437E−14 | −1.325441E−11 | 1.895192E−13 | 4.070884E−14 | −7.295815E−12 | −4.450410E−14 |
| 6 | 0 | 7.901848E−18 | −1.041209E−14 | −5.024097E−17 | 3.715636E−18 | −1.342384E−13 | 3.310262E−16 |
| 4 | 2 | 4.343412E−17 | 5.797301E−14 | −6.124526E−16 | −3.346679E−18 | −4.520468E−13 | 1.672236E−15 |
| 2 | 4 | 9.741217E−17 | −1.327696E−13 | 5.825645E−17 | −7.394452E−17 | −2.559015E−13 | 1.962740E−15 |
| 0 | 6 | −1.062718E−16 | 1.959294E−13 | 7.887476E−16 | −2.655830E−16 | −7.477396E−14 | 1.204820E−15 |
| 6 | 1 | −1.391817E−22 | 1.371466E−16 | −1.243631E−19 | 4.750035E−21 | 4.450177E−16 | −1.749391E−18 |
| 4 | 3 | −5.042526E−20 | 2.051000E−16 | −1.055869E−18 | −3.605139E−20 | 6.169208E−16 | −4.286471E−18 |
| 2 | 5 | −7.517225E−20 | 2.888296E−15 | −6.421060E−19 | 2.063961E−19 | 5.728123E−16 | −3.972902E−18 |
| 0 | 7 | 4.514499E−19 | −7.458838E−16 | −6.965850E−18 | 1.317042E−18 | −1.169984E−15 | −3.751270E−18 |
| 8 | 0 | −2.249703E−25 | 1.879685E−19 | 1.865490E−22 | 2.858313E−24 | −2.789321E−18 | 1.020537E−21 |
| 6 | 2 | 9.618696E−23 | −1.307586E−18 | −7.040576E−22 | 2.693660E−23 | −6.359395E−18 | 7.515349E−21 |
| 4 | 4 | 4.152614E−22 | 5.476085E−19 | −2.793697E−21 | 2.342709E−22 | −1.097113E−17 | 1.613314E−20 |
| 2 | 6 | 2.012692E−21 | −4.982682E−17 | −5.582448E−21 | −3.599690E−22 | −7.896961E−18 | 2.276418E−20 |
| 0 | 8 | −1.670620E−21 | 4.999865E−18 | −4.696409E−20 | −4.362010E−21 | −1.302749E−17 | 1.243271E−20 |
| 8 | 1 | 9.121520E−27 | −3.901016E−22 | 1.020670E−24 | −1.489633E−28 | 9.554198E−21 | −6.739667E−24 |
| 6 | 3 | 3.378031E−25 | −3.600711E−21 | −4.982307E−24 | −9.208653E−26 | 5.644310E−20 | −2.305324E−23 |
| 4 | 5 | −2.303521E−24 | 7.184598E−21 | −1.597483E−23 | −6.298048E−25 | 5.165746E−20 | −4.548523E−23 |
| 2 | 7 | −9.766881E−24 | 4.344373E−19 | −8.766463E−23 | 4.036785E−26 | 3.470226E−19 | −6.515923E−23 |
| 0 | 9 | 5.282909E−24 | −6.407964E−20 | 1.170643E−23 | 7.707831E−24 | 2.187385E−19 | −1.671689E−23 |
| 10 | 0 | 3.721162E−29 | −7.642119E−24 | −1.067762E−27 | 1.403956E−29 | −4.087293E−23 | 1.653756E−28 |
| 8 | 2 | −3.652356E−28 | 5.605620E−23 | 8.063235E−28 | 8.158023E−29 | −2.522082E−22 | −3.800397E−27 |
| 6 | 4 | −2.437748E−27 | 2.654084E−22 | −3.554079E−26 | 3.062915E−28 | −4.744488E−22 | 1.939290E−26 |
| 4 | 6 | 7.335216E−27 | 7.431988E−23 | −1.458571E−25 | 7.138636E−28 | −9.182602E−22 | 9.938038E−26 |
| 2 | 8 | 1.058829E−26 | −7.352344E−22 | −5.826656E−26 | 4.949294E−28 | −4.503482E−23 | 1.259617E−25 |
| 0 | 10 | −4.497373E−27 | 3.175801E−22 | 6.641212E−25 | −5.402030E−27 | −2.284624E−22 | 2.740074E−26 |

All the mirrors M1 to M6 are also configured as free form surfaces in the projection optics 37.

The image field 8 of the projection optics 37 is rectangular and, in the x-direction, has an extent of 26 mm and, in the y-direction, an extent of 2 mm.

Figure 9:
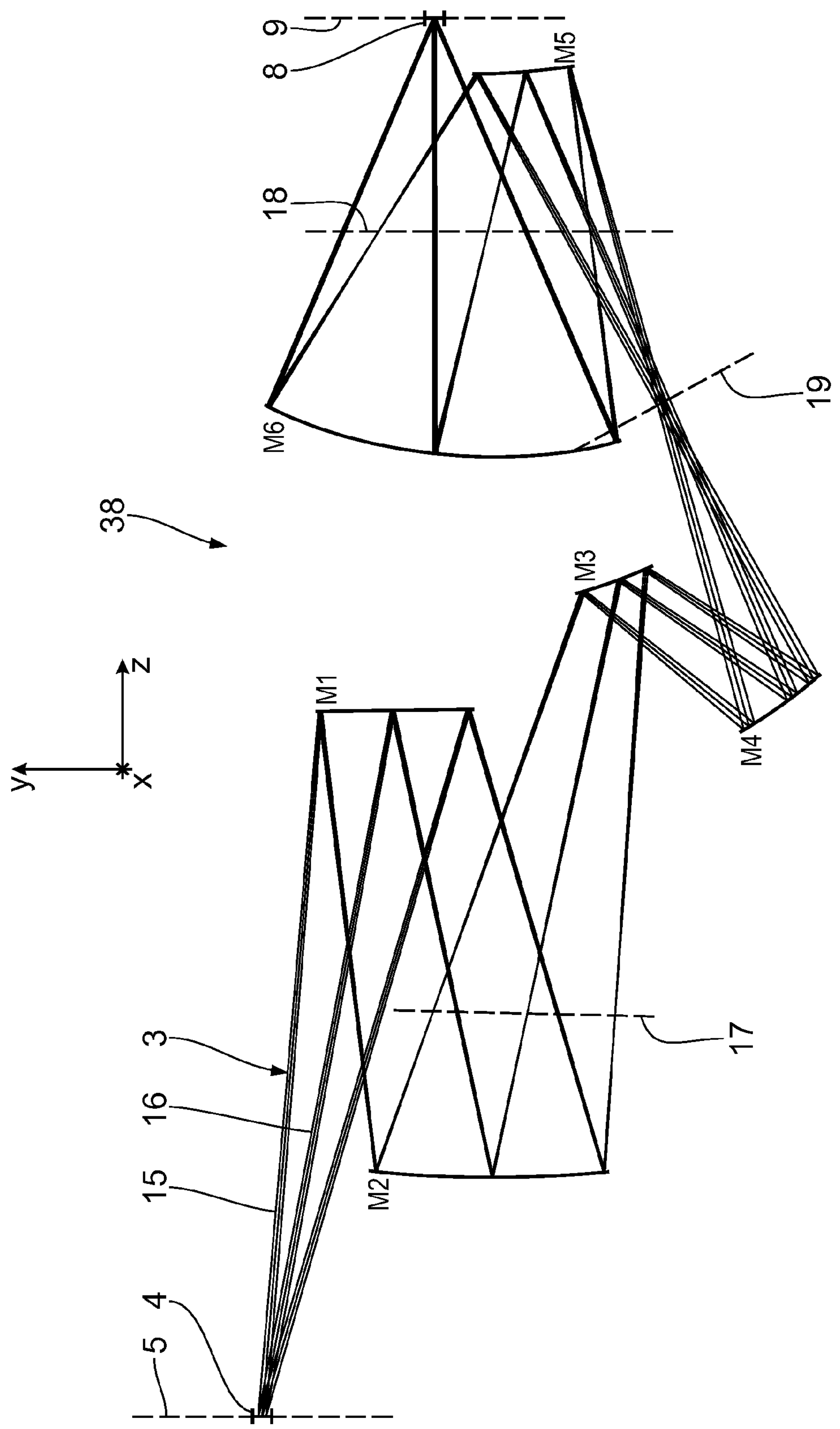

With the aid of FIG. 9, a further projection optics 38 is described, which can be used instead of the projection optics 7 in the projection exposure installation 1. Components of the projection optics 38, which correspond to those which have already been described above with reference to the projection optics 7 have the same designations and reference numerals and will not be described again in detail.

The mirrors M2, M4 and M6 are configured as concave mirrors. The mirrors M3 and M5 are configured as convex mirrors. The mirror M1 is configured virtually as a planar mirror but is no flat folding mirror. The projection optics 38 has a positive back focus. The entry pupil of the projection optics 38 is therefore located in the pupil plane 17. The intermediate image plane 19 is located closer to the image field 8 than the mirror M6 in the imaging beam path between the mirrors M4 and M5.

The optical data of the projection optics 38 according to FIG. 9 will be given below with the aid of a table, which in accordance with the table with respect to the projection optics 37 according to FIG. 8 is divided into a plurality of sub-tables. That which was already explained above with respect to the table of the projection optics 37 according to FIG. 8 applies in relation to the parameters given in the following table.

The mirrors M1 and M6, on the one hand, and M3 and M6 are arranged back to back with respect to one another with regard to the orientation of their reflection surfaces.

| Projection optics 38 | | | | | | | |
|---|---|---|---|---|---|---|---|
| | Object | M1 | M2 | M3 | M4 | M5 | M6 |
| Spacing | 757.397346 | −500.598246 | 613.754297 | −207.958321 | 775.562381 | −410.369428 | 469.90466 |
| y-decentration [mm] | | −226.489729 | −236.543067 | −234.232507 | −233.885653 | −234.056712 | −234.169697 |
| x-tilt [°] | | 0.100449 | −0.034404 | −0.118038 | 0.099917 | −0.021695 | 0.072521 |
| RDX [mm] | | 4448.952839 | 1114.480538 | 352.464724 | −493.432235 | 452.911834 | −507.464531 |
| RDY [mm] | | 4448.952839 | 1114.480538 | 352.464724 | −493.432235 | 452.911834 | −507.464531 |
| CCX | | −19.329669 | 0.576925 | −0.015219 | −0.003947 | −0.822152 | 0.070581 |
| CCY | | −19.329669 | 0.576925 | −0.015219 | −0.003947 | −0.822152 | 0.070581 |

| Polynomial coefficient | | | | | | | |
|---|---|---|---|---|---|---|---|
| x**i | y**j | M1 | M1 | M3 | M4 | M5 | M6 |
| 2 | 0 | −1.912033E−05 | 1.456929E−05 | −4.606215E−05 | 1.107804E−05 | 5.432659E−05 | 2.604116E−06 |
| 0 | 2 | 1.338827E−05 | −3.807134E−06 | −2.574800E−06 | 1.122748E−06 | −3.279027E−05 | 8.826986E−06 |
| 2 | 1 | 4.997711E−08 | 3.386603E−08 | 3.837772E−08 | −3.897652E−08 | 2.734195E−07 | 2.145453E−09 |
| 0 | 3 | 3.468793E−08 | 5.544309E−09 | 6.866750E−08 | −1.379140E−08 | −5.053815E−09 | 4.223441E−10 |
| 4 | 0 | 8.028223E−10 | 1.208232E−10 | 2.595612E−10 | 6.783660E−11 | 5.531355E−09 | 7.552575E−12 |
| 2 | 2 | 1.642877E−09 | 2.590476E−10 | −7.082738E−10 | 3.182797E−11 | 9.705896E−09 | 3.242180E−11 |
| 0 | 4 | 6.800249E−10 | 9.623761E−11 | −7.298023E−10 | 1.645519E−11 | 4.675339E−09 | 2.697612E−11 |
| 4 | 1 | −2.051999E−12 | 1.319770E−13 | 4.886747E−11 | −1.159188E−12 | −1.507973E−11 | 1.210488E−14 |
| 2 | 3 | −1.373328E−12 | 3.600722E−13 | 2.011521E−12 | 6.348235E−13 | −4.835914E−12 | 1.896112E−14 |
| 0 | 5 | 6.379200E−13 | 9.262448E−14 | 1.253641E−12 | −5.064252E−14 | 1.076335E−11 | 2.228690E−15 |
| 6 | 0 | −6.641611E−15 | 2.680055E−16 | −1.125951E−13 | −3.608343E−15 | 2.966747E−13 | −2.588370E−17 |
| 4 | 2 | −1.363403E−14 | 7.516649E−16 | 5.377924E−13 | −1.348904E−14 | 6.894506E−13 | −1.233545E−17 |
| 2 | 4 | −2.486367E−14 | 3.948532E−16 | −1.582380E−14 | 1.711637E−15 | 7.372341E−13 | 5.324431E−17 |
| 0 | 6 | −4.624897E−15 | −4.406081E−17 | −4.763141E−15 | 5.795798E−17 | 2.463834E−13 | 5.575562E−17 |
| 6 | 1 | 3.016870E−17 | 1.025259E−18 | −4.074276E−15 | −9.909008E−18 | 7.594696E−16 | 4.958573E−20 |
| 4 | 3 | 2.963211E−17 | 1.014462E−18 | 1.313227E−15 | −4.896925E−17 | −4.619078E−16 | 1.472140E−19 |
| 2 | 5 | 4.387878E−17 | 2.975993E−18 | 1.700448E−17 | −4.138458E−19 | 8.003270E−16 | 1.684098E−19 |
| 0 | 7 | −3.311115E−17 | 4.363058E−19 | −3.680502E−17 | −2.784372E−19 | −1.672970E−15 | 4.585137E−20 |
| 8 | 0 | 4.299594E−20 | 1.297107E−21 | −2.863584E−18 | 9.921819E−20 | 1.446419E−18 | −1.841853E−22 |
| 6 | 2 | 7.071563E−21 | 1.550762E−21 | −5.610826E−17 | 1.432201E−19 | 1.322673E−17 | −5.479706E−22 |
| 4 | 4 | 6.181308E−20 | 1.152506E−20 | −1.773466E−17 | −1.588070E−20 | 2.516878E−18 | −7.287658E−22 |
| 2 | 6 | 3.054122E−19 | 2.849153E−21 | −1.860313E−18 | 4.133864E−21 | 3.434075E−18 | −1.076096E−22 |
| 0 | 8 | 8.701209E−20 | −2.394535E−21 | −4.590426E−20 | −1.076456E−21 | −1.478072E−17 | −9.965210E−23 |
| 8 | 1 | −1.129870E−22 | 5.263823E−23 | −4.674483E−20 | 6.545604E−22 | 4.368701E−20 | 2.408720E−25 |
| 6 | 3 | 2.259681E−22 | 1.274875E−22 | −3.335405E−19 | 7.148158−22 | 1.398058E−19 | 1.192965E−24 |
| 4 | 5 | 2.278329E−22 | 1.568092E−22 | −1.328985E−19 | 2.242671E−22 | −7.827726E−21 | 1.473782E−24 |
| 2 | 7 | −1.640976E−21 | 1.043671E−22 | −1.821450E−20 | 2.456630E−23 | −9.093483E−20 | 3.898851E−25 |
| 0 | 9 | 4.888148E−22 | 2.445286E−23 | 4.071333E−22 | −1.282669E−24 | 1.072538E−21 | 4.499350E−25 |
| 10 | 0 | −2.057825E−25 | 5.947416E−26 | 1.591396E−23 | −4.901530E−26 | 1.296014E−22 | −1.899273E−27 |
| 8 | 2 | −6.791193E−25 | −2.994082E−25 | −1.975851E−22 | 1.088768E−24 | 1.137185E−21 | −4.854394E−27 |
| 6 | 4 | −1.788018E−24 | −3.403077E−25 | −7.363645E−22 | 9.020976E−25 | 1.883410E−21 | −7.544539E−27 |
| 4 | 6 | −1.703976E−24 | −1.209006E−25 | −2.856654E−22 | 3.287323E−25 | 7.936224E−22 | −3.641138E−27 |
| 2 | 8 | 2.421811E−24 | −1.397491E−25 | −5.147243E−23 | 3.036910E−26 | −2.1970920E−22 | 1.288085E−27 |
| 0 | 10 | −1.573535E−24 | 5.799999E−26 | −3.115624E−25 | 1.289855E−27 | 3.657117E−22 | −4.972006E−29 |

All the mirrors M1 to M6 are also configured as free form surfaces in the projection optics 38.

The image field 8 of the projection optics 38 is rectangular and just as large as the image field 8 of the projection optics 37.

Figure 10:
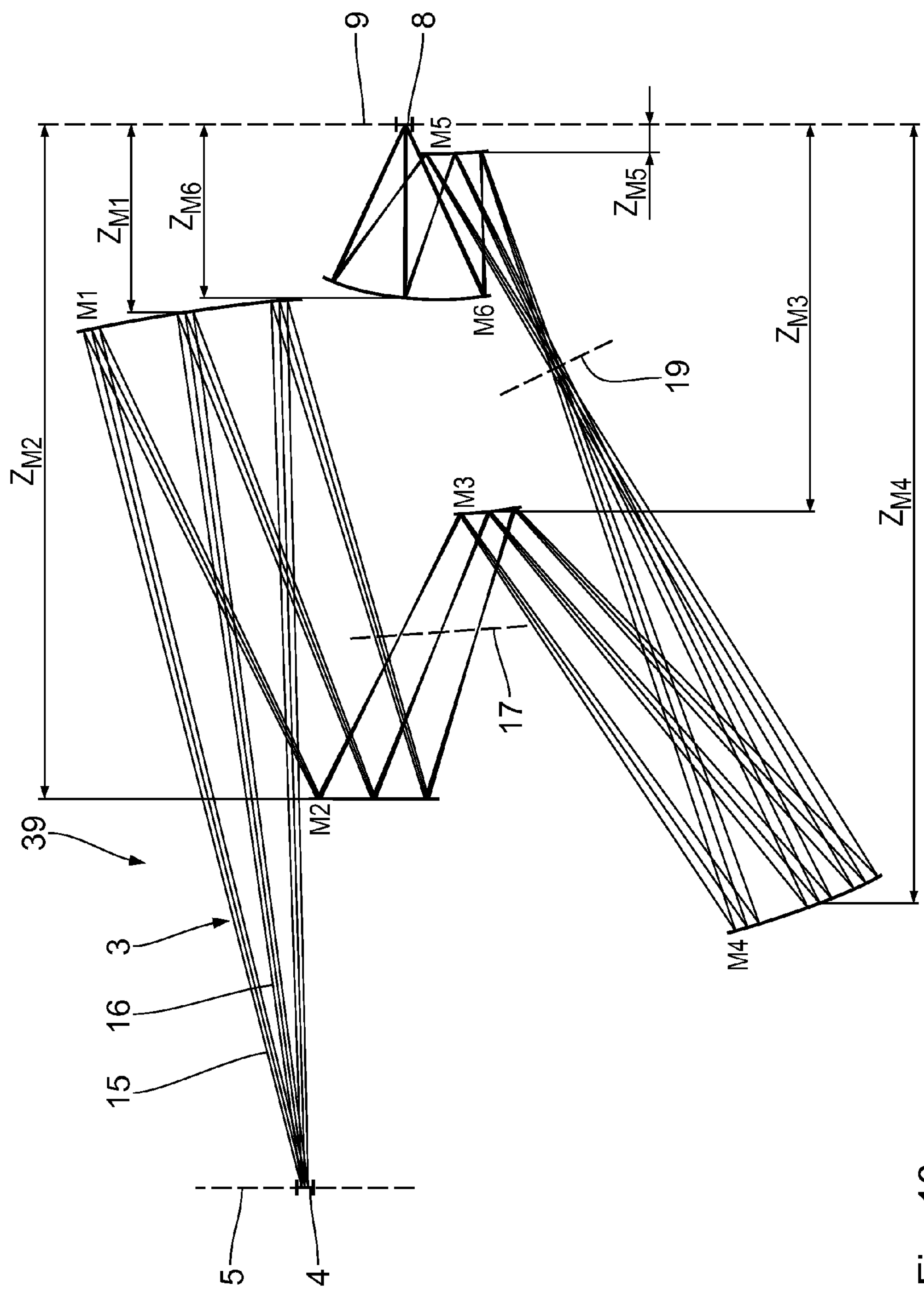

With the aid of FIG. 10, a further projection optics 39 is described, which can be used instead of the projection optics 7 in the projection exposure installation 1. Components of the projection optics 39, which correspond to those which have already been described above with reference to the projection optics 7 have the same designations an reference numerals and will not be discussed again in detail.

The mirrors M1, M4 and M6 are designed as concave mirrors. The mirrors M2, M3 and M5 are designed as convex mirrors.

The mirrors M1 and M6 and also the mirrors M3 and M6 are arranged back to back with regard to the orientation of their reflection surfaces.

A first pupil plane 17 located within the projection optics 39, in the projection optics 39, is located between the mirrors M2 and M3. The projection optics 39 has a negative back focus of the entry pupil, in other words, the chief rays 16 of the individual field points extend divergently with respect to one another from the object field 4 into the projection optics 39. The entry pupil in the projection optics is thus not located in the pupil plane 17, but in the imaging beam path before the object field 4. This makes it possible, for example, to arrange a pupil component of the illumination optics 6 in the entry pupil of the projection optics 7 in the beam path before the projection optics 39, without further imaging optical components having to be present between this pupil component and the object plane 5. The intermediate image plane 19 is located further away from the image field 8 than the mirror M6 in the imaging beam path between the mirrors M4 and M5.

In the unfolded imaging beam path in turn shown, an impingement point of a chief ray 16, which belongs to a central object field point, onto a useful face 23 of each of the mirrors M1 to M6, which is configured to guide the imaging light 3, has a mirror spacing $z_{M1}$ to $z_{M6}$ from the image plane 9. The mirror spacing $z_{M1}$ of the first mirror M1 is greater than the mirror spacing $z_{M6}$ of the last mirror M6. The mirror spacing $z_{M3}$ of the fourth to last mirror M3 is greater than the mirror spacing $z_{M1}$ of the first mirror M1. Overall, the following reaction applies to the mirror spacings $z_M$ of the six mirrors M1 to M6 of the projection optics 39:

$$z_{M4} > z_{M2} > z_{M3} > z_{M1} > z_{M6} > z_{M5}.$$

The optical data of the projection optics 39 according to FIG. 10 are reproduced below with the aid of a table, which, corresponding to the table with regard to the projection optics 7 according to FIG. 2, is divided into a plurality of sub-tables.

That which was already described above with respect to the table of the projection optics 7 according to FIG. 2 applies in relation to the other parameters reproduced in the following table.

| Projection optics 39 | | | | | | | |
|---|---|---|---|---|---|---|---|
| | Object | M1 | M2 | M3 | M4 | M5 | M6 |
| Spacing [mm] | 1386.45 | 784.4734 | 253.9653 | 709.614 | 1269.5579 | 225.6475 | 272.9549 |
| RDY [mm] | | −1542.0343 | −12252.8132 | 424.0155 | −1006.5283 | 384.4482 | −308.5166 |
| CCY | | 0.139 | −0.2476 | −2.2122 | −0.0427 | −3.146 | −0.7624 |

| Base asphere | Coefficient | M1 | M2 | M3 | M4 | M5 | M6 |
|---|---|---|---|---|---|---|---|
| | 4 | 1.55210E−12 | 7.12758E−10 | −2.00979E−09 | −1.69956E−12 | 1.77709E−08 | −3.56598E−09 |
| | 6 | −2.10097E−17 | −2.86812E−15 | 6.82142E−14 | −1.54273E−17 | −1.95832E−13 | −2.88595E−14 |
| | 8 | 1.80608E−22 | −1.39084E−20 | −4.19443E−18 | 6.71377E−23 | 2.89020E−16 | −6.39281E−20 |
| | 10 | −1.49777E−27 | 2.90084E−24 | −1.09913E−22 | −2.87690E−28 | −5.47432E−20 | −3.66835E−24 |
| | 12 | 7.49885E−33 | −1.80081E−28 | 3.29029E−26 | 7.19980E−34 | 1.83545E−23 | −8.92547E−29 |
| | 14 | −2.16061E−38 | 6.38760E−33 | −2.48125E−30 | −1.06791E−39 | −5.34237E−27 | 2.87084E−33 |
| | 16 | 2.68479E−44 | −9.36904E−38 | 7.27577E−35 | 6.91473E−46 | 6.19503E−31 | −6.53453E−38 |

| Polynomial coefficient | | | | | | | |
|---|---|---|---|---|---|---|---|
| x**i | y**j | M1 | M2 | M3 | M4 | M5 | M6 |
| 0 | 1 | −1.05821E−05 | −1.04545E−05 | −2.06750E−06 | 3.17793E−07 | 5.78141E−06 | 7.61528E−07 |
| 2 | 0 | 1.25206E−07 | 7.09722E−08 | −1.47506E−08 | 1.53137E−07 | 9.17367E−07 | 4.10742E−08 |
| 0 | 2 | 5.23158E−09 | 5.93192E−07 | 1.15741E−06 | 6.76900E−08 | 7.88985E−07 | 2.25320E−07 |
| 2 | 1 | −1.57097E−09 | −4.96444E−09 | 8.27945E−08 | 8.72700E−10 | −1.33485E−08 | 7.14890E−10 |
| 0 | 3 | 4.91586E−10 | −2.88564E−09 | 4.59932E−08 | 3.13279E−11 | −2.93456E−08 | −4.01197E−10 |
| 4 | 0 | −2.33463E−12 | 1.24522E−13 | 4.88686E−10 | −2.72122E−12 | −1.27456E−09 | −2.21726E−11 |
| 2 | 2 | 1.04923E−11 | −4.82114E−11 | 3.05841E−09 | 2.37369E−12 | −2.87497E−09 | −5.44492E−11 |
| 0 | 4 | −2.77181E−12 | −6.47964E−11 | 3.12031E−10 | −7.85179E−13 | −1.91952E−09 | −4.06701E−11 |
| 4 | 1 | 2.87027E−14 | 2.11287E−13 | −3.92082E−12 | −1.96751E−14 | 1.38065E−11 | −2.09427E−14 |
| 2 | 3 | −2.12392E−14 | 2.35084E−12 | 2.75201E−11 | 1.38387E−15 | 9.51885E−12 | 2.34810E−14 |
| 0 | 5 | 5.15609E−15 | 7.29612E−13 | −5.43716E−12 | −1.19056E−15 | 1.45767E−11 | 8.65117E−14 |
| 6 | 0 | 2.07288E−17 | −9.49679E−16 | −8.39108E−14 | 1.46559E−17 | 9.18090E−13 | 2.86039E−15 |
| 4 | 2 | −1.36757E−16 | 2.61158E−16 | −4.27057E−13 | −5.20956E−17 | 2.63876E−12 | 8.41611E−15 |
| 2 | 4 | −3.61890E−17 | −2.65375E−14 | −1.59134E−13 | −6.67827E−18 | 2.91949E−12 | 8.10389E−15 |
| 0 | 6 | 1.03592E−17 | −9.51680E−16 | −5.31253E−14 | 3.18043E−18 | 1.04311E−12 | 2.80228E−15 |
| 6 | 1 | −2.14682E−19 | −1.46879E−17 | −1.01566E−16 | 1.59700E−19 | −1.62939E−15 | 1.53918E−18 |
| 4 | 3 | 2.18205E−19 | −4.06435E−17 | −4.53139E−15 | −3.65728E−20 | −7.27071E−15 | 4.84488E−20 |
| 2 | 5 | 1.72103E−19 | 1.17481E−16 | −3.73345E−15 | −5.24707E−21 | 6.97910E−16 | 1.18396E−18 |
| 0 | 7 | −5.18090E−20 | −1.81924E−17 | 2.57099E−16 | 7.67792E−21 | −5.91230E−15 | −2.01898E−18 |
| 8 | 0 | −9.79383E−23 | 1.30497E−19 | 1.41750E−18 | 1.57847E−22 | −2.77329E−16 | −1.47979E−19 |
| 6 | 2 | 8.10089E−22 | 3.33447E−19 | 3.61452E−17 | 5.19213E−22 | −9.75070E−16 | −6.22734E−19 |
| 4 | 4 | 8.63234E−23 | 4.75062E−19 | −1.53947E−18 | 3.50114E−23 | −1.27917E−15 | −9.73542E−19 |
| 2 | 6 | −1.40330E−22 | −1.51358E−19 | −2.28361E−17 | 9.69888E−24 | −6.60902E−16 | −6.34689E−19 |
| 0 | 8 | 1.57741E−23 | 4.19178E−20 | 1.39621E−18 | −1.55334E−24 | −2.95936E−16 | −1.37445E−19 |
| 8 | 1 | 4.26130E−25 | −1.27688E−22 | −3.75949E−19 | 1.83105E−25 | −4.28339E−19 | −8.36264E−23 |
| 6 | 3 | −1.18690E−24 | −7.26974E−22 | 4.79003E−19 | 6.11176E−25 | 1.10227E−20 | 6.47800E−22 |
| 4 | 5 | −5.81246E−25 | −2.40501E−21 | 2.08361E−19 | 1.39305E−26 | 5.36886E−18 | 1.83306E−21 |
| 2 | 7 | −1.63935E−25 | 1.39329E−22 | −6.24130E−20 | 1.66566E−27 | 1.10483E−17 | 1.30990E−21 |
| 0 | 9 | 1.35162E−25 | 3.98173E−22 | −2.25706E−20 | −9.42103E−27 | 2.06224E−19 | 2.49218E−22 |
| 10 | 0 | −2.24440E−27 | −3.47785E−24 | −7.32177E−22 | −2.13596E−27 | 2.84318E−20 | 2.90670E−24 |
| 8 | 2 | −2.75528E−28 | −1.01732E−23 | −1.51353E−20 | −7.82099E−28 | 7.16813E−20 | 1.63580E−23 |
| 6 | 4 | 5.70062E−28 | −1.65767E−23 | 8.31627E−22 | 2.67888E−28 | 3.75839E−20 | 3.43414E−23 |
| 4 | 6 | 4.94545E−28 | 7.78811E−24 | 1.49635E−21 | −1.21278E−29 | 1.95349E−20 | 3.03666E−23 |
| 2 | 8 | 3.03461E−28 | 4.90410E−25 | −3.73204E−23 | −2.84874E−30 | 2.32573E−19 | 7.21846E−24 |
| 0 | 10 | −1.22869E−28 | −1.96970E−24 | −8.06816E−23 | 1.59541E−31 | 2.31614E−20 | 7.06455E−25 |
| 10 | 1 | 2.28221E−29 | −8.96094E−26 | −3.08291E−23 | −5.36216E−30 | 2.03048E−23 | 1.71815E−27 |
| 8 | 3 | −7.26011E−30 | 2.04575E−25 | −2.24188E−22 | −9.09482E−31 | −4.96765E−22 | −7.38139E−26 |
| 6 | 5 | −4.67090E−31 | 2.08987E−25 | −3.27192E−23 | 2.68722E−31 | −4.87512E−21 | −2.42725E−25 |
| 4 | 7 | 5.38110E−31 | 2.19030E−26 | −2.39638E−24 | 3.42398E−32 | −5.94398E−21 | −2.09851E−25 |
| 2 | 9 | 9.19080E−32 | −1.05376E−26 | −3.20006E−24 | 7.89512E−33 | 5.11004E−22 | −2.97018E−26 |
| 0 | 11 | −1.15913E−32 | 3.76459E−27 | 2.99863E−26 | 2.04908E−34 | 3.99321E−23 | −1.75225E−27 |
| 12 | 0 | −6.82941E−33 | 2.46003E−28 | −2.97693E−28 | 5.38924E−33 | −7.08850E−25 | 5.68530E−30 |
| 10 | 2 | −4.03599E−32 | 4.91779E−28 | −3.51097E−25 | −4.40764E−33 | 6.16472E−24 | 7.37359E−29 |
| 8 | 4 | 1.82358E−32 | −1.34663E−27 | −1.12638E−24 | 6.55860E−34 | 1.20865E−23 | 7.42243E−28 |
| 6 | 6 | 8.30748E−34 | −7.65641E−28 | −2.02734E−25 | 2.46600E−34 | −3.19516E−23 | 1.53296E−27 |
| 4 | 8 | −8.79369E−34 | −1.82077E−28 | −5.21869E−26 | 9.65848E−36 | −3.74880E−23 | 1.13575E−27 |
| 2 | 10 | −1.97287E−34 | 1.42055E−29 | −2.05524E−26 | 8.46175E−36 | 3.22536E−24 | 2.80987E−28 |
| 0 | 12 | 8.41068E−36 | −4.11198E−30 | −6.57882E−28 | −2.28399E−36 | 8.09476E−25 | 4.55550E−29 |

The image field 8 of the projection optics 39 is also a ring field with an extent of 26 mm in the x-direction and 2.5 mm in the y-direction.

Figure 11:
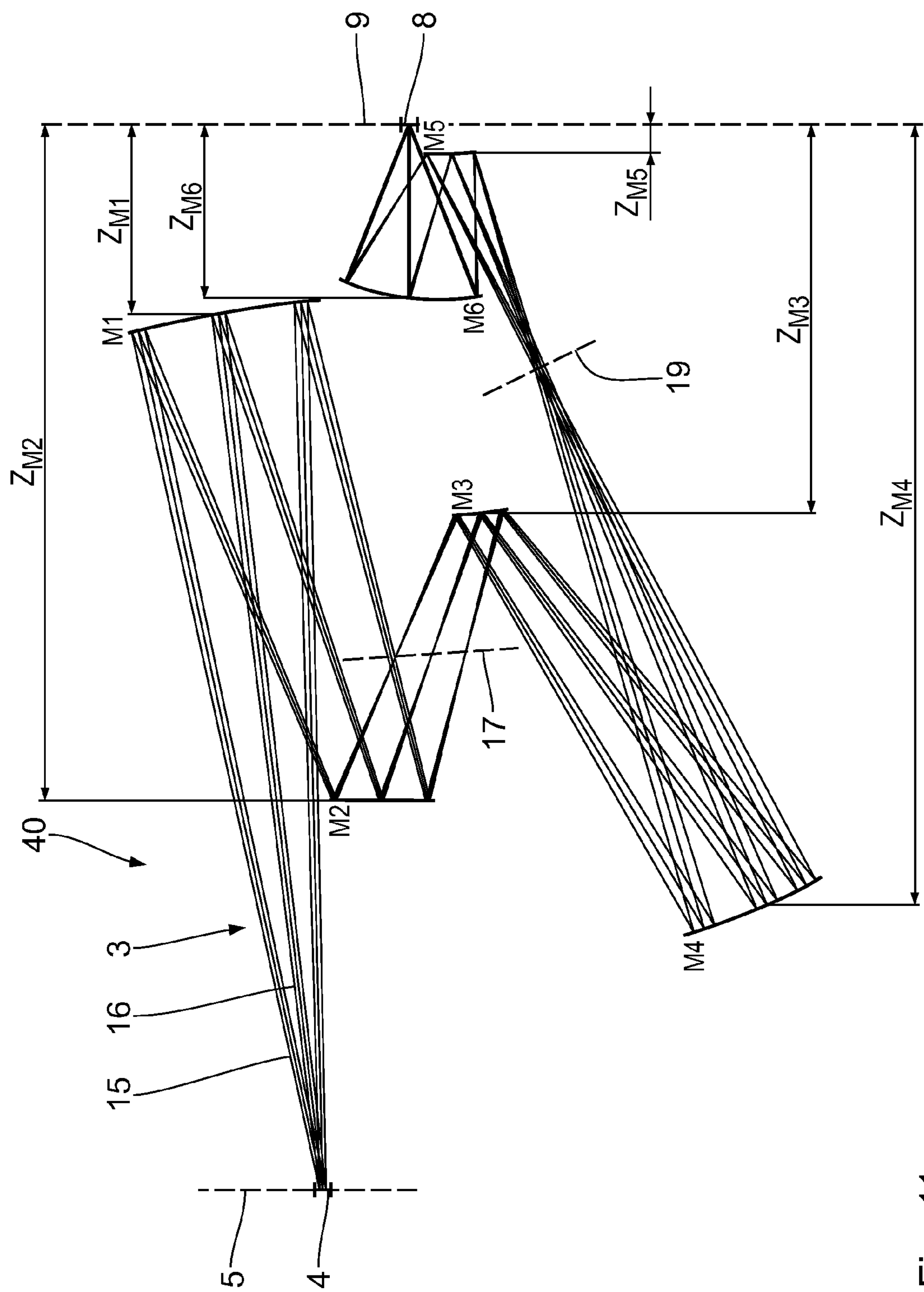

The optical data of a further projection optics 40, which is shown in FIG. 11, will be reproduced below with the aid of a table, which, corresponding to the table with regard to the projection optics 7 according to FIG. 2, is divided into a plurality of sub-tables.

With reference to the other parameters reproduced in the following table, that which was already stated above with regard to the table of the projection optics 7 according to FIG. 2 applies:

| Projection optics 40 | | | | | | | |
|---|---|---|---|---|---|---|---|
| | Object | M1 | M2 | M3 | M4 | M5 | M6 |
| Spacing [mm] | 1374.75 | 770.5646 | 233.201 | 700.3556 | 1271.1562 | 228.3205 | 276.5032 |
| RDY [mm] | | −1490.8777 | 158762.7 | 432.2834 | −1002.5296 | 390.2455 | −311.1974 |
| CCY | | −0.2328 | −51.0752 | −2.296 | −0.0364 | −2.7523 | −0.9564 |

| Base asphere | Coefficient | M1 | M2 | M3 | M4 | M5 | M6 |
|---|---|---|---|---|---|---|---|
| | 4 | −1.28845E−11 | 8.45971E−10 | −1.90244E−09 | −3.00200E−12 | 1.46534E−08 | −4.30430E−09 |
| | 6 | 2.00285E−18 | −5.96111E−15 | 6.85403E−14 | 1.23450E−18 | 9.11198E−13 | −2.44709E−14 |
| | 8 | −1.46259E−22 | 1.95974E−19 | −6.16441E−18 | −1.50010E−23 | −4.73955E−17 | −2.51196E−19 |
| | 10 | 6.33330E−28 | −7.38214E−24 | 3.16369E−22 | 1.77685E−29 | 1.61154E−20 | −1.42315E−24 |
| | 12 | −1.57661E−33 | 1.86350E−28 | −9.59262E−27 | −2.26256E−35 | −3.03364E−24 | 5.77550E−30 |
| | 14 | 1.80851E−39 | −2.33616E−33 | 1.88504E−31 | 9.95217E−42 | 3.24618E−28 | −5.40857E−34 |

| Polynomial coefficient | | | | | | | |
|---|---|---|---|---|---|---|---|
| x**i | y**j | M1 | M2 | M3 | M4 | M5 | M6 |
| 0 | 1 | −5.02396E−05 | 1.46487E−05 | 6.46394E−05 | −4.02868E−05 | 1.79099E−05 | −1.58478E−06 |
| 2 | 0 | 6.35807E−08 | −6.47319E−08 | −2.25884E−07 | −9.68150E−08 | −4.22514E−07 | −9.01080E−08 |
| 0 | 2 | 3.11601E−07 | −5.99596E−08 | 3.86770E−06 | −2.03420E−07 | −2.10611E−08 | 1.46083E−07 |
| 2 | 1 | −4.02653E−10 | −4.19602E−09 | 6.31654E−08 | 1.22348E−10 | −1.96485E−08 | 1.00473E−09 |
| 0 | 3 | −3.31518E−10 | 5.34637E−09 | 8.34246E−08 | −1.77150E−10 | −1.97080E−08 | −5.82766E−11 |
| 4 | 0 | 1.04601E−12 | 1.20116E−12 | 4.66047E−10 | 2.87508E−13 | 4.66729E−10 | 1.55166E−11 |
| 2 | 2 | 5.67680E−12 | −6.32934E−11 | 2.52080E−09 | 3.95559E−12 | 1.03971E−09 | 2.33383E−11 |
| 0 | 4 | −1.05866E−12 | −1.85830E−10 | 3.45980E−10 | 1.99027E−13 | 2.03780E−10 | −6.27607E−12 |
| 4 | 1 | −1.12762E−14 | 4.50034E−13 | 1.27537E−13 | −6.93251E−15 | 1.63616E−11 | −2.89672E−14 |
| 2 | 3 | −1.65428E−14 | 2.18171E−12 | 2.81181E−11 | 8.89113E−15 | 1.75143E−11 | −2.91044E−14 |
| 0 | 5 | 2.03785E−15 | 1.82469E−12 | −7.11120E−12 | −9.96559E−16 | 2.18693E−11 | 8.95554E−14 |
| 6 | 0 | −2.97689E−17 | 8.63319E−16 | −8.08538E−14 | 2.09407E−18 | −1.38698E−13 | −1.50709E−15 |
| 4 | 2 | −2.35434E−17 | 2.71413E−15 | −2.44888E−13 | −5.23307E−17 | −5.53123E−13 | −4.82812E−15 |
| 2 | 4 | −7.39077E−17 | −1.18692E−14 | 1.59175E−14 | −6.83791E−18 | −2.15366E−13 | −5.13601E−15 |
| 0 | 6 | −4.33922E−18 | −3.15874E−15 | −4.60979E−14 | −2.44187E−18 | 4.97860E−14 | −1.65759E−15 |
| 6 | 1 | 2.30105E−19 | −5.00584E−17 | −9.67498E−16 | 1.12769E−19 | −4.26661E−15 | 7.78570E−19 |
| 4 | 3 | 2.52487E−19 | −3.22569E−17 | −2.06714E−15 | −1.03773E−19 | −1.05830E−14 | 1.56689E−18 |
| 2 | 5 | 3.39000E−19 | −5.08869E−17 | −1.18805E−15 | −3.43137E−20 | −3.13535E−15 | 5.69105E−18 |
| 0 | 7 | 5.59841E−21 | −3.29985E−17 | 4.27995E−16 | 1.26937E−21 | −6.20899E−15 | 1.96463E−19 |
| 8 | 0 | 1.37285E−22 | −2.30788E−20 | 5.34928E−18 | 9.32849E−23 | 1.01265E−17 | 6.17745E−20 |
| 6 | 2 | −3.57974E−22 | −7.53122E−20 | 3.06203E−20 | 5.95338E−22 | 5.93012E−17 | 2.50931E−19 |
| 4 | 4 | −3.61659E−22 | −8.97373E−19 | 1.37284E−17 | −4.02576E−23 | 2.07627E−16 | 3.79041E−19 |
| 2 | 6 | −1.68982E−22 | 2.36328E−19 | 1.25454E−18 | −1.96706E−23 | 1.70967E−16 | 2.32490E−19 |
| 0 | 8 | 2.44659E−23 | 4.55062E−21 | 3.61277E−18 | 2.26448E−24 | −2.31433E−17 | 5.87652E−20 |
| 8 | 1 | −9.38919E−25 | 2.91462E−21 | 4.21189E−20 | 3.77657E−25 | 9.81314E−19 | −2.62947E−23 |
| 6 | 3 | −1.95655E−25 | 6.51892E−21 | −8.43429E−20 | 1.06528E−24 | 2.79910E−18 | −4.11078E−23 |
| 4 | 5 | 8.23350E−26 | 1.02342E−20 | 1.54327E−19 | 4.25376E−26 | 6.34580E−18 | 1.87928E−22 |
| 2 | 7 | −6.12738E−25 | 3.29484E−21 | 6.70412E−20 | 1.27754E−26 | 5.31003E−18 | 1.84709E−22 |
| 0 | 9 | −3.32697E−26 | 9.07518E−22 | −4.88978E−21 | −2.97203E−27 | 3.86616E−19 | 1.09279E−22 |
| 10 | 0 | 2.19332E−28 | −3.81731E−24 | −8.28082E−23 | −3.11902E−29 | 7.32258E−22 | −4.74127E−25 |
| 8 | 2 | 1.26513E−27 | −1.70152E−23 | −2.80133E−22 | 3.90454E−28 | 5.35717E−21 | −2.59112E−24 |
| 6 | 4 | 2.89444E−28 | −2.36971E−23 | −1.22201E−21 | 6.22869E−28 | 4.64860E−22 | −5.60227E−24 |
| 4 | 6 | −1.66963E−28 | −2.45692E−23 | −4.25689E−24 | 1.07465E−29 | 2.64096E−20 | −7.05751E−24 |
| 2 | 8 | 5.62006E−28 | −1.39377E−23 | 1.26077E−22 | 1.04696E−29 | 4.07595E−20 | −3.89167E−24 |
| 0 | 10 | −1.69273E−29 | −5.03702E−25 | −6.30760E−23 | −7.85416E−31 | −3.21592E−21 | −1.27797E−24 |
| 0 | 12 | 9.07785E−37 | −3.45962E−29 | −9.71841E−28 | −2.05195E−36 | 8.07476E−25 | 6.61794E−30 |

The projection optics 40 according to FIG. 11 otherwise corresponds to the projection optics 39 according to FIG. 10. It is therefore not desirable to describe the projection optics 40 again in detail, but reference can be made to the statements regarding the above-described projection optics and, in particular, to the statements on the projection optics 39 according to FIG. 10. Components and reference numerals of the projection optics 40, which correspond to those which have already been described above with reference, in particular, to the projection optics 39, in FIG. 11, have the same designations and reference numerals and will not be discussed again in detail.

Typical characteristics of the projection optics 7 and 36 to 40 described above will again be summarised with the aid of a table.

| | Projection optics 7 | Projection optics 36 | Projection optics 37 | Projection optics 38 | Projection optics 39 | Projection optics 40 |
|---|---|---|---|---|---|---|
| NA | 0.36 | 0.33 | 0.38 | 0.38 | 0.33 | 0.33 |
| Field size [$mm^2$] | 26 × 2 | 26 × 2.5 | 26 × 2 | 26 × 2 | 26 × 2.5 | 26 × 2.5 |
| Field form | Ring field | Ring field | Rectangle | Rectangle | Ring field | Ring field |
| Ring field radius [mm] (only for ring fields) | 149 | 147 | no data | no data | 157.775 | 157.775 |
| Spacing entry pupil-reticle [mm] | 1400 | −1290 | −1495 | 1400 | −1500 | −1500 |
| Chief rayangle at the reticle [°] | 6 | −6 | −6 | 10 | 6 | 6 |
| Installation length [mm] | 1625 | 1698 | 1849 | 1498 | 1650 | 1650 |
| Wavefront error rms [mλ] | 7.2 | 8.1 | 12.7 | 23.7 | 14.4 | 15.4 |
| Distortion [nm] | 0.62 | 0.97 | 0.87 | 1.06 | 0.8 | 0.8 |
| Telecentricity [mrad] | 1.43 | 0.99 | 0.62 | 2.88 | 1.5 | 1.8 |

NA designates the numerical aperture on the image side of the respective projection optics.

The installation length in this case designates the spacing between the object plane 5 and the image plane 9.

The imaging errors given in the table, in other words the wavefront error, the distortion and the telecentricity are maximum values over the respective image field 8.

The telecentricity value given in the table is the angle of a dense beam of an illumination light beam bundle issuing from a point of the object field 4 toward a face normal of the image plane 9.

The following four tables summarise the maximum arrow height or sagitta deviations (deviation best fit asphere), on the one hand, and the maximum normal angle deviation (gradient), on the other hand, for each of the six mirrors M1 to M6 for the projection optics 7 according to FIG. 2, for the projection optics 36 according to FIG. 7, for the projection optics 39 according to FIG. 10 and for the projection optics 40 according to FIG. 11.

| Projection optics 7 | | |
|---|---|---|
| Mirror | Deviation best fit asphere [μm] | Gradient [μrad] |
| 1 | 0.50 | 15.4 |
| 2 | 1.01 | 24.0 |
| 3 | 0.95 | 34.7 |
| 4 | 0.93 | 14.7 |
| 5 | 0.34 | 29.5 |
| 6 | 1.14 | 17.5 |

| Projection optics 36 | | |
|---|---|---|
| Mirror | Deviation best fit asphere [μm] | Gradient [μrad] |
| 1 | 2.23 | 33.7 |
| 2 | 1.16 | 35.0 |
| 3 | 0.76 | 62.8 |
| 4 | 2.17 | 18.5 |
| 5 | 0.39 | 52.6 |
| 6 | 1.53 | 45.6 |

| Projection optics 39 | | |
|---|---|---|
| Mirror | Deviation best fit asphere [μm] | Gradient [μrad] |
| 1 | 0.74 | 11.4 |
| 2 | 0.72 | 14.9 |
| 3 | 0.27 | 15 |
| 4 | 2.78 | 5.8 |
| 5 | 0.33 | 15 |
| 6 | 0.42 | 9.3 |

| Projection optics 40 | | |
|---|---|---|
| Mirror | Deviation best fit asphere [μm] | Gradient [μrad] |
| 1 | 1.78 | 13.7 |
| 2 | 0.6 | 15.4 |
| 3 | 0.78 | 18.3 |
| 4 | 0.54 | 6.1 |
| 5 | 0.26 | 17.9 |
| 6 | 0.47 | 11.1 |

To produce a microstructured or nanostructured component, the projection exposure installation 1 is used as follows: firstly the reflection mask 10 or the reticle and the substrate or the wafer 11 are provided. A structure on the reticle 10 is then projected onto a light-sensitive layer of the wafer 11 with the aid of the projection exposure installation. By developing the light-sensitive layer, a microstructure or nanostructure on the wafer 11 is then produced and therefore the microstructured component is produced.

What is claimed is:

1. An imaging optics, comprising:

a plurality of mirrors configured to guide imaging light along an imaging beam path from an object field in an object plane to an image field in an image plane to image the object field into the image field, wherein:

a reflection surface of one of the plurality of mirrors is a static free form surface which cannot be described by a rotationally symmetrical function;

during use of the imaging optics, a region of the static free form mirror is in the imaging beam path;

the region of the static free form surface comprises a plurality of surface elements;

the static free form surface differs from a best fit aspherical surface;

the best fit aspherical surface is describable by a rotationally symmetrical function;

the best fit aspherical surface comprises a plurality of surface elements;

for each surface element of the static free form surface, there is a corresponding surface element of the best fit aspherical surface; and a normal to each surface element of the region of the static free form surface has a maximum of angle 70 μrad with respect to a normal to the corresponding surface element of the best fit aspherical surface.

2. The imaging optics of claim 1, wherein the free form surface deviates from the best fit aspherical surface by more than a wavelength of the imaging light.

3. The imaging optics of claim 2, wherein the imaging optics comprises precisely six mirrors.

4. The imaging optics of claim 3, wherein the imaging optics is a microlithography projection optics.

5. The imaging optics of claim 1, wherein the imaging optics has an image side numerical aperture of greater than 0.3.

6. The imaging optics of claim 1, wherein the image field covers an area delimited by sides having an extent of at least 1 mm.

7. The imaging optics of claim 1, wherein the imaging optics has a maximum wavefront error of 25 mλ, and λ is a wavelength of the imaging light.

8. The imaging optics of claim 1, wherein the imaging optics has a maximum distortion of 1.1 nm.

9. A projection exposure installation, comprising:

a projection optics comprising an imaging optics according to claim 1; and an illumination optics configured to guide illumination light towards the object field of the imaging optics.

10. The projection exposure installation of claim 9, wherein the imaging optics comprises precisely six mirrors.

11. The projection exposure installation of claim 9, wherein the imaging optics has an image side numerical aperture of greater than 0.3.

12. The projection exposure installation of claim 9, wherein the illumination light has a wavelength of between 5 and 30 nm.

13. The projection exposure installation of claim 9, wherein the projection exposure installation is a microlithography projection exposure installation.

14. The imaging optics of claim 1, wherein the imaging optics has a minimum telecentricity of 3 mrad.

15. The imaging optics of claim 1, wherein the imaging optics is a microlithography projection optics.

16. The projection exposure installation of claim 9, wherein the free form surface deviates from the best fit aspherical surface by more than a wavelength of the imaging light.

17. A method, comprising:

a) providing a projection exposure installation comprising:

a light source configured to provide illumination light;

a projection optics comprising an imaging optics according to claim 1; and an illumination optics configured to guide the illumination light towards the object field of the imaging optics; and b) using the projection exposure installation to project a structure on a reticle onto a light-sensitive layer of a wafer.

18. The method of claim 17, further comprising, after b), producing a structure on the wafer.

19. The method of claim 17, wherein the free form surface deviates from the best fit aspherical surface by more than a wavelength of the imaging light.

20. The method of claim 17, wherein the imaging comprises precisely six mirrors.

* * * * *